(12) United States Patent
Jo et al.

(10) Patent No.: US 10,134,984 B1
(45) Date of Patent: Nov. 20, 2018

(54) TWO-TERMINAL MEMORY ELECTRODE COMPRISING A NON-CONTINUOUS CONTACT SURFACE

(71) Applicant: Crossbar, Inc., Santa Clara, CA (US)

(72) Inventors: Sung Hyun Jo, Sunnyvale, CA (US); Joanna Bettinger, Oakland, CA (US); Xianliang Liu, Emeryville, CA (US); Zeying Ren, Albany, CA (US); Xu Zhao, Richmond, CA (US); Fnu Atiquzzaman, Berkeley, CA (US)

(73) Assignee: CROSSBAR, INC., Santa Clara, CA (US)

( * ) Notice: Subject to any disclaimer, the term of this patent is extended or adjusted under 35 U.S.C. 154(b) by 75 days.

(21) Appl. No.: 14/587,644

(22) Filed: Dec. 31, 2014

(51) Int. Cl.
*H01L 45/00* (2006.01)

(52) U.S. Cl.
CPC .......... *H01L 45/1253* (2013.01); *H01L 45/14* (2013.01); *H01L 45/146* (2013.01); *H01L 45/1608* (2013.01)

(58) Field of Classification Search
CPC .............. H01L 45/1233; H01L 45/1253; H01L 45/1273; H01L 45/16
See application file for complete search history.

(56) References Cited

U.S. PATENT DOCUMENTS

| | | | | |
|---|---|---|---|---|
| 6,031,287 A * | 2/2000 | Harshfield | ......... | G11C 13/0004 257/734 |
| 8,592,797 B2 * | 11/2013 | Nejad | ..................... | H01L 45/06 257/4 |
| 8,728,932 B2 * | 5/2014 | Liu | ......................... | H01L 45/06 257/E45.002 |
| 9,059,403 B2 * | 6/2015 | Sills | .................... | H01L 45/1253 |
| 9,349,950 B2 * | 5/2016 | Walls | .................. | H01L 45/1253 |

OTHER PUBLICATIONS

Wu et al., "A Low Power Phase Change Memory Using Thermally Confined TaN/TiN Bottom Electrode," 2011, IEEE International Electron Devices Meeting, 4 pages.

* cited by examiner

*Primary Examiner* — Mark Prenty
(74) *Attorney, Agent, or Firm* — Amin, Turocy & Watson, LLP

(57) ABSTRACT

Providing an electrode for a two-terminal memory device is described herein. By way of example, the electrode can comprise a contact surface that comprises at least one surface discontinuity. For instance, the electrode can have a gap, break, or other discontinuous portion of a surface that makes electrical contact with another component of the two-terminal memory device. In one example, the contact surface can comprise an annulus or an approximation of an annulus, having a discontinuity within a center of the annulus, for instance. In some embodiments, a disclosed electrode can be formed from a conductive layer deposited over a non-continuous surface formed by a via or trench in an insulator, or over a pillar device formed from or on the insulator.

20 Claims, 17 Drawing Sheets

MEMORY DEVICE PROCESS
400

VIA ETCH, CLEAN & DEPOSITION
400A

OXIDE FILL & SMOOTHING
400B

MEMORY DEVICE PROCESS
500

PILLAR ETCH, CLEAN &
DEPOSITION
500A

OXIDE FILL & SMOOTHING
500B

EXAMPLE MEMORY
ARCHITECTURE
1200

TWO-TERMINAL MEMORY ELECTRODE COMPRISING A NON-CONTINUOUS CONTACT SURFACE

TECHNICAL FIELD

This disclosure relates generally to electronic memory, for example, the disclosure describes a non-continuous electrode for a two-terminal memory device.

BACKGROUND

A recent innovation within the field of integrated circuit technology is two-terminal memory technology. Two-terminal memory technology is contrasted, for instance, with gate-controlled technology in which conductivity between two terminals is mediated by a third terminal, called a gate terminal. Two-terminal memory devices can differ from three terminal devices in function as well as structure. For instance, some two-terminal devices can be constructed between a pair of conductive contacts, as opposed to a third terminal that is adjacent to a set of conductive terminals. The inventors are further aware of multiple two-terminal memory technologies, such as phase-change memory, magneto-resistive memory, as well as others.

One two-terminal memory worth noting is resistive memory. While much of resistive memory technology is in the development stage, various technological concepts for resistive memory have been demonstrated by the assignee of the present invention and are in one or more stages of verification to prove or disprove associated theory(ies). Even so, resistive memory technology promises to hold substantial advantages over competing technologies in the semiconductor electronics industry.

Resistive random access memory (RRAM) is an example of resistive memory. The inventors of the present disclosure believe RRAM has the potential to be a high density non-volatile information storage technology. Generally, RRAM stores information by controllably switching among distinct resistive states. A single resistive memory can store a single bit of information, or multiple bits, and can be configured as a one-time programmable cell, or a programmable and erasable device, as various memory models demonstrated by the assignee provide.

Various theories have been proposed by the inventors to explain the phenomenon of resistive switching. In one such theory, resistive switching is a result of formation of a localized conductive structure (e.g., a conductive filament) within an otherwise electrically insulating medium. The localized conductive structure could be formed from ions, atoms that can be ionized under appropriate circumstances (e.g., a suitable electric field), or other charge carrying mechanisms. In other such theories, field-assisted diffusion of atoms can occur in response to a suitable electric potential applied to a resistive memory cell. In still other theories proposed by the inventors, formation of the conductive filament can occur in response to joule heating and electro-chemical processes in binary oxides (e.g., NiO, $TiO_2$, or the like), or by a redox process for ionic conductors including oxides, chalcogenides, polymers, and so on.

The inventors expect resistive devices based on an electrode-insulator-electrode model to exhibit good endurance and life cycle. Further, the inventors expect such devices to have high on-chip densities. Accordingly, resistive elements may be viable alternatives to metal-oxide semiconductor (MOS) transistors employed for digital information storage. The inventors of the subject patent application, for instance, believe that models of resistive-switching memory devices provide some potential technical advantages over non-volatile Flash MOS devices.

In light of the above, the inventors endeavor to make further improvements in memory technology, including two-terminal memory and resistive memory.

SUMMARY

The following presents a simplified summary of the specification in order to provide a basic understanding of some aspects of the specification. This summary is not an extensive overview of the specification. It is intended to neither identify key or critical elements of the specification nor delineate the scope of any particular embodiments of the specification, or any scope of the claims. Its purpose is to present some concepts of the specification in a simplified form as a prelude to the more detailed description that is presented in this disclosure.

Various aspects of the present disclosure provide an electrode for a two-terminal memory device. In some embodiments, the electrode can be a surface (e.g., a contact surface) that is at least in part non-continuous. For instance, the electrode can have a gap, or discontinuity, on a surface such that a subset of the surface makes electrical contact with another component of the two-terminal memory device. In some embodiments, the electrode can comprise an annulus or an approximation of an annulus, having a discontinuity within a center of the annulus, for instance. In another embodiment(s), an electrode can be formed via a conductive layer over a non-continuous surface formed by a via or trench in an insulator. In still another embodiment, the electrode can be formed via a conductive layer over a non-continuous surface formed by a pillar device formed from the insulator.

In further embodiments, the present disclosure provides a two-terminal memory device. The two-terminal memory device can comprise a first electrode and a non-volatile switching layer adjacent to the first electrode, the non-volatile switching layer is configured to have a first physical characteristic associated with a first state and a second physical characteristic, measurably distinct from the first physical characteristic, associated with a second state. Furthermore, the two-terminal memory device can comprise a second electrode comprising an electrode surface at least partially in physical contact with a subset of a switching layer surface of the non-volatile switching layer, wherein the electrode surface comprises a discontinuous area within a perimeter of the electrode surface that is physically separate from the switching layer surface.

In another embodiment(s), there is described a method of fabricating an electrode of a two-terminal memory device. The method can comprise forming a metal layer on a substrate of a memory device. The method can further comprise forming an oxide layer over the metal layer. Furthermore, the method can comprise forming a via in the oxide layer and providing a conductive film over a subset of a contour surface of the oxide layer formed by the via. In addition to the foregoing, the method can comprise forming a non-volatile memory device over a subset of the conductive film, the subset of the conductive film serving as an electrode for the non-volatile memory device.

According to still other embodiments, the subject disclosure provides a method of fabricating a two-terminal memory. The method can comprise forming an oxide layer over a substrate of a memory device and patterning and etching the oxide layer to form a pillar device. Further, the method can comprise providing a conductive material over a subset of an exposed surface of the pillar device and providing a non-volatile switching material over the pillar device and in direct or indirect contact with the conductive material. Moreover, the method can comprise forming a second conductive material over the switching material.

The following description and the drawings set forth certain illustrative aspects of the specification. These aspects are indicative, however, of but a few of the various ways in which the principles of the specification may be employed. Other advantages and novel features of the specification will become apparent from the following detailed description of the specification when considered in conjunction with the drawings.

BRIEF DESCRIPTION OF THE DRAWINGS

Various aspects or features of this disclosure are described with reference to the drawings, wherein like reference numerals are used to refer to like elements throughout. In this specification, numerous specific details are set forth in order to provide a thorough understanding of this disclosure. It should be understood, however, that certain aspects of the subject disclosure may be practiced without these specific details, or with other methods, components, materials, etc. In other instances, well-known structures and devices are shown in block diagram form to facilitate describing the subject disclosure.

DETAILED DESCRIPTION

Figure 1:
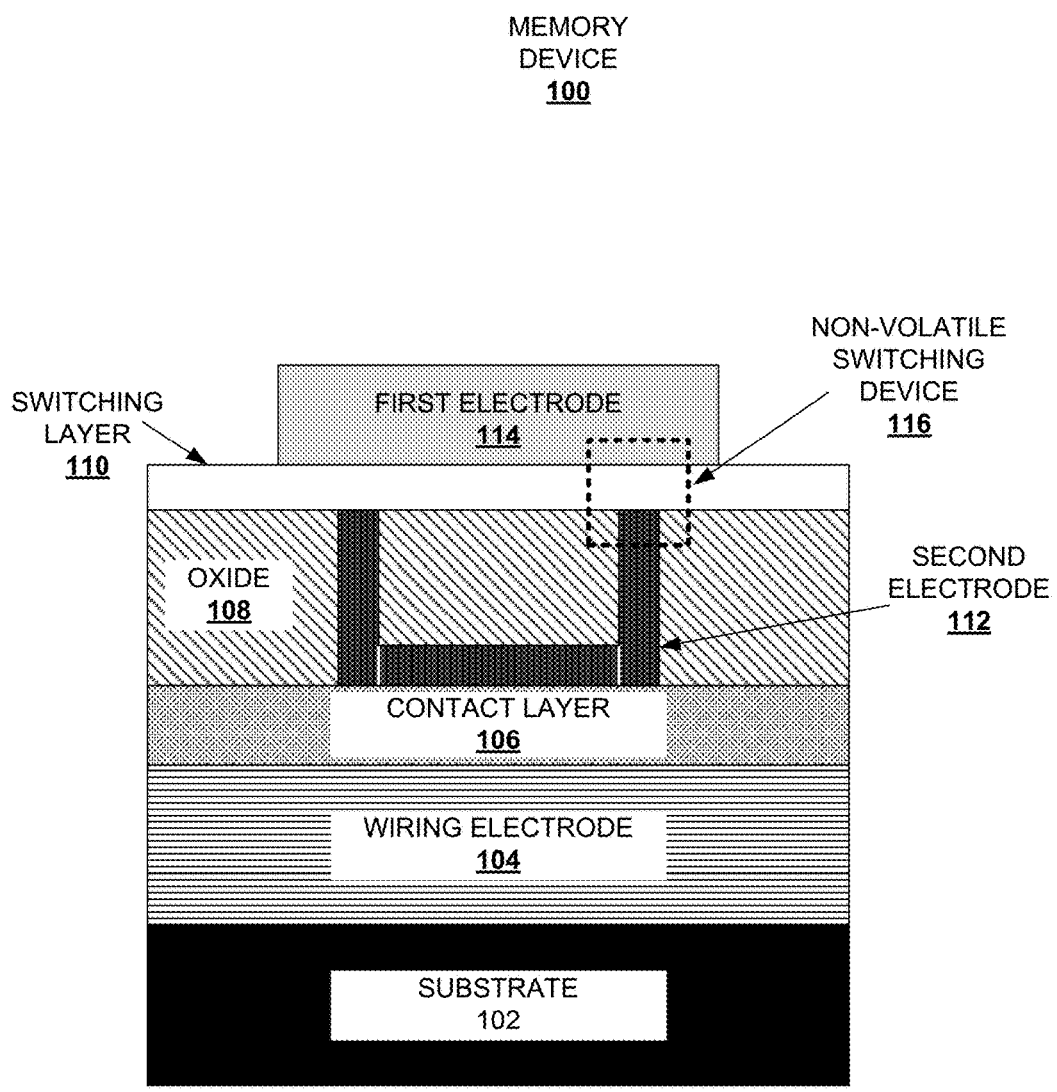
FIG. 1 illustrates a block diagram of an example two-terminal memory according to embodiments of the subject disclosure.

This disclosure relates to two-terminal memory cells employed for digital information storage. In some embodiments, the two-terminal memory cells can include a resistive technology, such as a resistive-switching two-terminal memory cell. Resistive-switching two-terminal memory cells (also referred to as resistive-switching memory cells or resistive-switching memory), as utilized herein, comprise circuit components having conductive contacts with an active region between the two conductive contacts. The active region of the two-terminal memory device, in the context of resistive-switching memory, exhibits a plurality of stable or semi-stable resistive states, each resistive state having a distinct electrical resistance. Moreover, respective ones of the plurality of states can be formed or activated in response to a suitable electrical signal applied at the two conductive contacts. The suitable electrical signal can be a voltage value, a current value, a voltage or current polarity, or the like, or a suitable combination thereof. Examples of a resistive switching two-terminal memory device, though not exhaustive, can include a resistive random access memory (RRAM), a phase change RAM (PCRAM) and a magnetic RAM (MRAM).

Embodiments of the subject disclosure can provide a filamentary-based memory cell. One example of a filamentary-based memory cell can comprise: a conductive layer, e.g., metal, doped p-type (or n-type) silicon (Si) bearing layer (e.g., p-type or n-type polysilicon, p-type or n-type polycrystalline SiGe, etc.), a resistive switching layer (RSL) and an active metal layer capable of being ionized. Under suitable conditions, the active metal layer can provide filament forming ions to the RSL. When the conditions are removed, e.g. a voltage is removed, the ions become neutral metal particles, and become trapped within crystalline defects of the resistive switching layer. In various embodiments, the entrapped neutral metal particles help form a conductive filament (e.g., in response to an ionizing stimulus, such as a read voltage or other stimulus suitable to re-ionize the neutral metal particles) within the resistive switching layer.

In various embodiments of the present disclosure, a p-type or n-type Si bearing layer can include a p-type or n-type polysilicon, p-type or n-type SiGe, or the like. A RSL (which can also be referred to in the art as a resistive switching media (RSM)) can comprise, e.g., an amorphous Si layer, a semiconductor layer having intrinsic characteristics, a Si sub-oxide (e.g., SiOx wherein x has a value between 0.1 and 2), and so forth. Other examples of materials suitable for the RSL could include $Si_xGe_yO_z$ (where X, Y and Z are respective suitable positive numbers), a silicon oxide (e.g., $SiO_N$, where N is a suitable positive number), amorphous Si (a-Si), amorphous SiGe (a-SiGe), $TaO_B$ (where B is a suitable positive number), $HfO_C$ (where C is a suitable positive number), $TiO_D$ (where D is a suitable number), $Al_2O_E$ (where E is a suitable positive number), $NbO_F$ (where F is a suitable positive number), and so forth, or a suitable combination thereof.

An active metal layer for a filamentary-based memory cell can include, among others: silver (Ag), gold (Au), nickel (Ni), copper (Cu), aluminum (Al), chromium (Cr), iron (Fe), manganese (Mn), vanadium (V), cobalt (Co), platinum (Pt), hafnium (Hf), palladium (Pd), or a suitable alloy of the foregoing. Other suitable conductive materials, as well as compounds or combinations of the foregoing or similar materials can be employed for the active metal layer in some aspects of the subject disclosure. Some details pertaining to embodiments of the subject disclosure similar to the foregoing example(s) can be found in the following U.S. patent applications that are licensed to the assignee of the present application for patent: application Ser. No. 11/875,541 filed Oct. 19, 2007 and application Ser. No. 12/575,921 filed Oct. 8, 2009, each of which are incorporated by reference herein in their respective entireties and for all purposes.

To program a filamentary-based resistive switching memory cell, a suitable program voltage can be applied across the memory cell causing a conductive path or a filament to form through a relatively high resistive portion of the memory cell. This causes the memory cell to switch from a relatively high resistive state, to a relatively low resistive state. In some resistive-switching devices, an erase process can be implemented to deform the conductive filament, at least in part, causing the memory cell to return to the high resistive state from the low resistive state. This change of state, in the context of memory, can be associated with respective states of a binary bit. For an array of multiple memory cells, a word(s), byte(s), page(s), block(s), etc., of memory cells can be programmed or erased to represent zeroes or ones of binary information, and by retaining those states over time in effect storing the binary information In various embodiments, multi-level information (e.g., multiple bits) may be stored in such memory cells.

It should be appreciated that various embodiments herein may utilize a variety of memory cell technologies, having different physical properties. For instance, different resistive-switching memory cell technologies can have different discrete programmable resistances, different associated program/erase voltages, as well as other differentiating characteristics. For instance, various embodiments of the subject disclosure can employ a bipolar switching device that exhibits a first switching response (e.g., programming to one of a set of program states) to an electrical signal of a first polarity and a second switching response (e.g., erasing to an erase state) to the electrical signal having a second polarity. The bipolar switching device is contrasted, for instance, with a unipolar device that exhibits both the first switching response (e.g., programming) and the second switching response (e.g., erasing) in response to electrical signals having the same polarity and different magnitudes.

Where no specific memory cell technology or program/erase voltage is specified for the various aspects and embodiments herein, it is intended that such aspects and embodiments incorporate any suitable memory cell technology and be operated by program/erase voltages appropriate to that technology, as would be known by one of ordinary skill in the art or made known to one of ordinary skill by way of the context provided herein. It should be appreciated further that where substituting a different memory cell technology would require circuit modifications that would be known to one of ordinary skill in the art, or changes to operating signal levels that would be known to one of such skill, embodiments comprising the substituted memory cell technology(ies) or signal level changes are considered within the scope of the subject disclosure.

The inventors of the subject application are familiar with additional non-volatile, two-terminal memory structures in addition to resistive memory. For example, ferroelectric random access memory (RAM) is one example. Some others include magneto-resistive RAM, organic RAM, phase change RAM and conductive bridging RAM, and so on. Two-terminal memory technologies have differing advantages and disadvantages, and trade-offs between advantages and disadvantages are common. Though resistive-switching memory technology is referred to with many of the embodiments disclosed herein, other two-terminal memory technologies can be utilized for some of the disclosed embodiments, where suitable to one of ordinary skill in the art.

In various disclosed embodiments, there is provided a two-terminal memory device comprising an electrode, or contact, having one or more discontinuities in a contact surface of the electrode. In some embodiments, the discontinuity(ies) can limit contact area of the electrode, providing control over electrical characteristics of the two-terminal memory (e.g., conductive current, leakage current, resistance, etc.). In other embodiments, the discontinuity(ies) can provide a non-perpendicular contact region, facilitating an increased electric field for the contact surface compared to a perpendicular contact region. Also disclosed are various alternatives of such a two-terminal memory device, as well as one or more methods for manufacturing such device(s).

FIG. 1 depicts a block diagram of an example memory device 100 according to various disclosed embodiments. Memory device 100 can be a two-terminal non-volatile memory, over a substrate 102. Substrate 102 can be a silicon substrate, in some embodiments, or other suitable insulated semiconductor material. In some embodiments, substrate 102 can be a control logic substrate, such as a complementary metal oxide semiconductor (CMOS) substrate. Above substrate 102 is a wiring electrode 104. Wiring electrode 104 can be formed from a metal layer provided above substrate 102. In some embodiments, memory device 100 can comprise one or more other layers between wiring electrode 104 and substrate 102 (e.g., see FIG. 8, infra). In other embodiments, wiring electrode 104 can be directly above substrate 102.

In some embodiments, a contact layer 106 can be formed over wiring electrode 104. In alternative or additional embodiments, memory device 100 can have no contact layer 106 above wiring electrode. When present, contact layer 106 can be selected to facilitate or modulate conductivity between wiring electrode 104 and other components of memory device 100.

An oxide layer 108 can be formed over contact layer 106, in some embodiments, or over wiring electrode 104 in other embodiments. A non-volatile switching layer 110 can be formed above oxide layer 108. In various embodiments, switching layer 110 can comprise one or more components according to a switching technology employed for memory device 100. For instance, the one or more components can comprise a material(s) suitable for a phase-change memory, a magnetic memory, magneto-resistive memory, a resistive-switching memory, ferroelectric memory, organic memory, conductive bridging memory, or the like, in various embodiments. A first electrode 114 can be formed above switching layer 110, and a second electrode 112 can be formed at least in part within oxide layer 108. A junction of first electrode 114, switching layer 110 and second electrode 112 can form a non-volatile switching device 116. Although memory device 100 is depicted with non-volatile switching device 116 at a right side of second electrode 112, it should be appreciated that non-volatile switching device 116 can be formed at other suitable locations where second electrode 112 contacts (e.g., directly or indirectly) switching layer 110, or at multiple such locations, where suitable.

As depicted, second electrode 112 can comprise a discontinuity in a top surface in contact with switching layer 110. In the example depicted by memory device 100, the discontinuity can be a central hole filled with oxide layer 108, forming a top surface of second electrode 112 as an annulus, an approximation of an annulus, or other suitable shape (e.g., a polygon or approximate polygon having the central hole, or the like). In some embodiments, the top surface of second electrode 112 that is in contact with switching layer 110 can have a top surface dimension that limits current, or has an electrical resistance or range of resistances, for non-volatile switching device 116. In some embodiments, the top surface dimension can be a surface area of the top surface. In alternative or additional embodiments, the top surface dimension can be a width of a continuous subset of the top surface (e.g., a width of a subset of the top surface that is in direct contact with switching layer 110). In providing an electrical resistance for non-volatile switching device 116, second electrode 112 can facilitate improved switching performance for a set of memory devices 100, greater current uniformity, reduced joule heating, or the like, for such devices.

In further embodiments, first electrode 114, second electrode 112 or wiring electrode 104 can be comprised of W, Ti, Cu, Al, Ag, Cu, Pt, Pd, Ta, Ni, Cr metal nitrides, TiN, WN, TaN, or the like, or a suitable combination of the foregoing. In some embodiments, first electrode 114, second electrode 112 and wiring electrode 104 can comprise the same or similar material. In other embodiments, one or more of first electrode 114, second electrode 112 or wiring electrode 104 can be comprised of different ones of the above materials. In at least one embodiment, first electrode 114 can be comprised of an active metal, second electrode 112 can be comprised of a conductive metal or a conductive (e.g., doped) silicon or silicon compound, and wiring electrode 104 can be comprised of a conductive metal.

In additional embodiments, switching layer 110 can comprise an amorphous silicon (a-Si), TiOx, AlOx, HfOx, SiOx, TaOx, CuOx, NbOx or WOx, or the like, or a suitable combination of the foregoing. Switching layer 110 typically includes a number of structural defects in the crystal pattern. In some embodiments, switching layer 110 is not intentionally undoped during fabrication. As discussed above, the defects trap neutral metal particles in the resistive switching layer that are provided by either first electrode 114 or second electrode 112. Further, contact layer 106 can comprise a metal oxide (e.g., TiOx, AlOx, HfOx, SiOx, TaOx, CuOx, WOx, NbOx etc.), a metal nitride (e.g., TiN, WN, TaN, and so forth), or the like, or a suitable combination thereof. In further embodiments, substrate 102 can comprise an insulated semiconductor material. Examples can include Si, a suitable Si compound (e.g., doped polysilicon, doped polycrystalline, SiGe), or the like. In the case where Cu is used for wiring electrode 104, using a Damascene process, contact layer 106 may also be a barrier layer, such as TiN, TaN, WTi, or the like, that, for example, mitigates or prevents migration of Cu atoms into or through contact layer 106.

Figure 2:
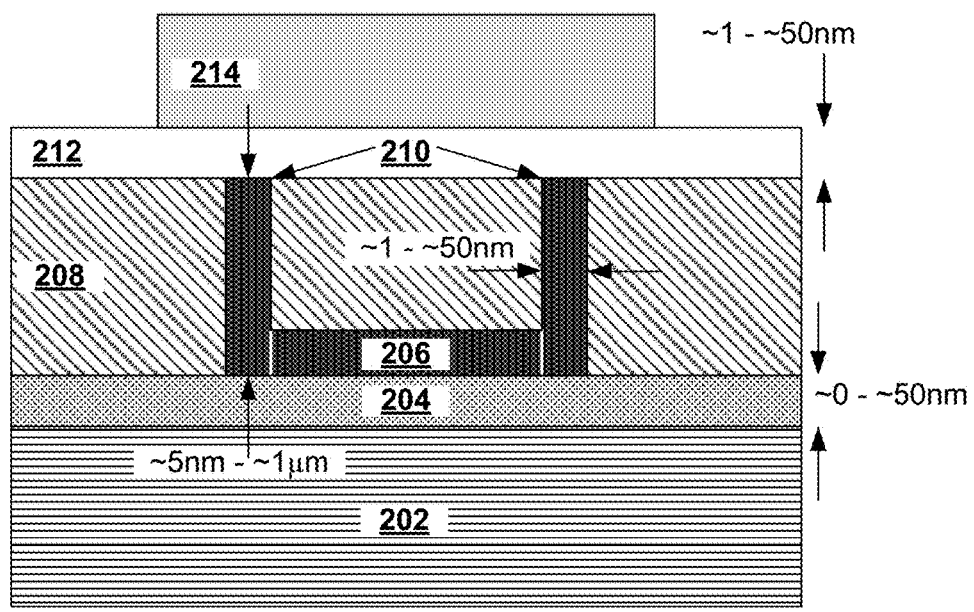
FIG. 2 depicts a block diagram of an example two-terminal memory according to further embodiments.

FIG. 2 depicts a block diagram of a sample memory device 200 according to alternative or additional aspects of the present disclosure. Memory device 200 can be substantially similar to memory device 100, of FIG. 1 supra, in some embodiments. However, the subject disclosure is not so limited, and in other embodiments memory device 200 can differ from memory device 100.

Memory device 200 can comprise a wiring electrode 202. Wiring electrode 202 can comprise, e.g., a wire formed of a metal layer of a memory device. In one embodiment, the wire can be formed from a back-end-of-line process over a semiconductor substrate (e.g., see FIGS. 8, 11, 12, infra). In some embodiments, a contact layer 204 is provided above wiring electrode 202. In other embodiments, memory device 200 does not comprise contact layer 204. Additionally, memory device 200 can comprise a second electrode 206 formed within an insulator layer 208. Second electrode 206 can comprise a top surface 210 having a continuous portion in direct contact with a switching layer 212, and one or more non-continuous portions not in direct contact with switching layer 212. Additionally, memory device 200 can comprise a first electrode 214 above switching layer 212. A non-volatile switching device can be formed by second electrode 206, switching layer 212 and first electrode 214.

In various embodiments, contact layer 204 can have a thickness in a range of about 50 nanometers (nm) or less. In further embodiments, second electrode 206 can have a total height in a range from about 5 nm to about 1000 nm. In at least one additional embodiment, top surface 210 of second electrode 206 can have a continuous portion in electrical contact with switching layer 212 that is in a range from about 1 nm to about 50 nm in width. In a further embodiment(s), switching layer 212 can have a thickness in a range from about 1 nm to about 50 nm.

Figure 2A:
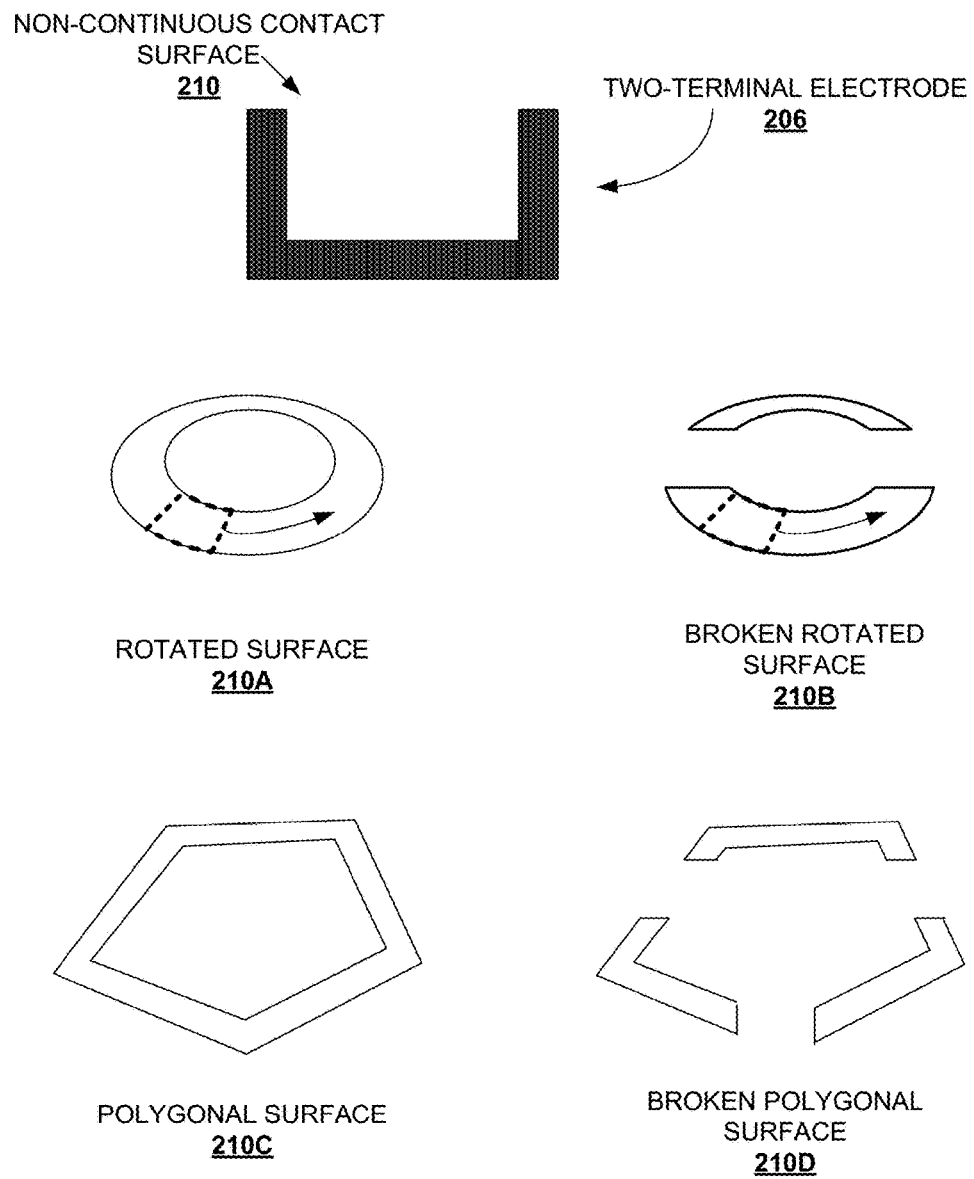
FIG. 2A illustrates a diagram of example discontinuous electrode surfaces for a two-terminal memory, in additional embodiments.

FIG. 2A illustrates diagrams of example non-continuous surfaces for top surface 210 of second electrode 206. In a first example, non-continuous contact surface 210 can comprise a rotated surface 210A. Rotated surface 210A can be an annulus or an approximate annulus, as depicted, although other rotated shapes can be utilized as well. A broken rotated surface 210B can be a further example. Broken rotated surface 210B can be an annulus or approximate annulus having one or more discontinuities in a perimeter of broken rotated surface 210B. In additional embodiments, non-continuous contact surface 210 can comprise a polygonal surface 210C, having three or more sides, with a central discontinuity(ies) (e.g., a central hole). Another example of non-continuous contact surface 210 can include a broken polygonal surface 210D. Broken polygonal surface 210 can comprise a surface with three or more sides, and one or more discontinuities about a perimeter of broken polygonal surface 210D.

In one or more embodiments, a dimension(s) of non-continuous contact surface 210 can be selected to control current density through non-continuous contact surface 210. In some embodiments, a diameter of non-continuous contact surface 210 can be selected to provide a target current density, or electrical resistance, through non-continuous contact surface 210. In another embodiment(s), a width of a segment of non-continuous contact surface 210 can be selected to provide the target current density or electrical resistance. In still other embodiments, a total surface area, or other suitable dimension, or a combination of the foregoing, can be selected to provide the target current density or electrical resistance.

Figure 3:
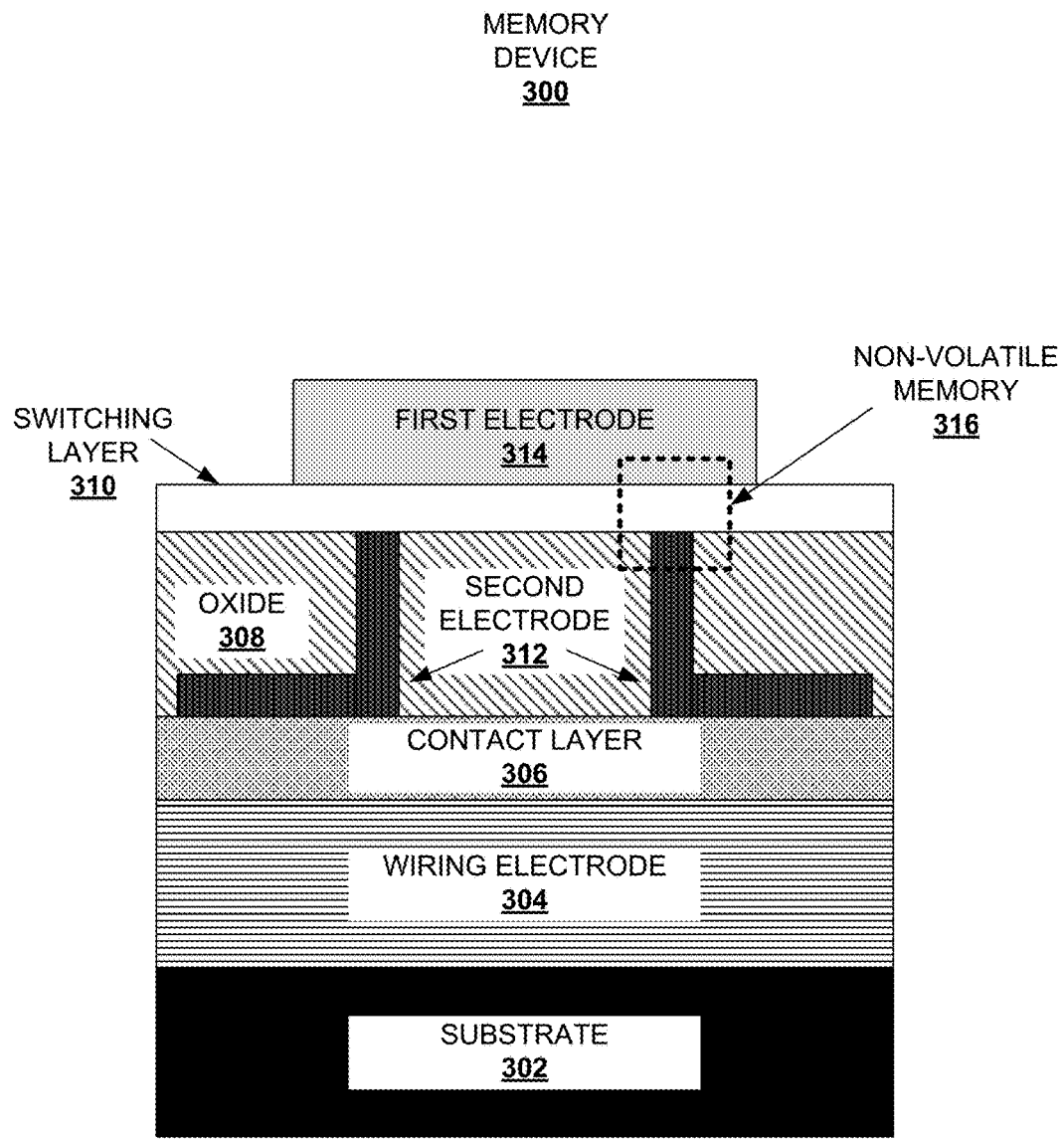
FIG. 3 depicts a block diagram of a sample two-terminal memory according to alternative or additional embodiments.

FIG. 3 depicts a block diagram of a memory device 300 according to alternative or additional embodiments of the present disclosure. Memory device 300 can be fabricated on a substrate 302. In some embodiments, substrate 302 can be a control logic substrate, such as a complementary metal oxide semiconductor (CMOS) substrate 302. In further embodiments, substrate 302 can be fabricated at least in part with front-end-of-line processing, and can include one or more active or passive devices, such as a transistor(s), a resistor(s), a capacitor(s), an inductor(s), or the like. In additional embodiments, other components of memory device 300 can be fabricated at least in part with back-endof-line processing. However, it should be appreciated that the subject disclosure is not so limited; other mechanisms for preparing or fabricating electronic components in or on a semiconductor are considered within the scope of the subject disclosure.

Above substrate 302 can be formed a wiring electrode 304. Wiring electrode 304 can be comprised of suitable conductive materials, such as a metal, a metal alloy (e.g., a metal nitride), a doped semiconductor, and so forth. In some embodiments, a contact layer 306 can be formed over wiring electrode 304. Contact layer 306 can be comprised of a metal oxide or a metal nitride, in particular embodiments. In further embodiments, an oxide 308 can be formed above wiring electrode 304 (or contact layer 306). Furthermore, a second electrode 312 can be formed at least in part within oxide 308. In some embodiments, second electrode 312 can have a discontinuity at least at a top surface in contact with a switching layer 310 of memory device 300. In further embodiments, second electrode 312 can have a second discontinuity at a bottom surface in contact with contact layer 306 (or in contact with wiring electrode 304 in some embodiments). Switching layer 310 can be formed between oxide 308 and a first electrode 314.

Figure 6:
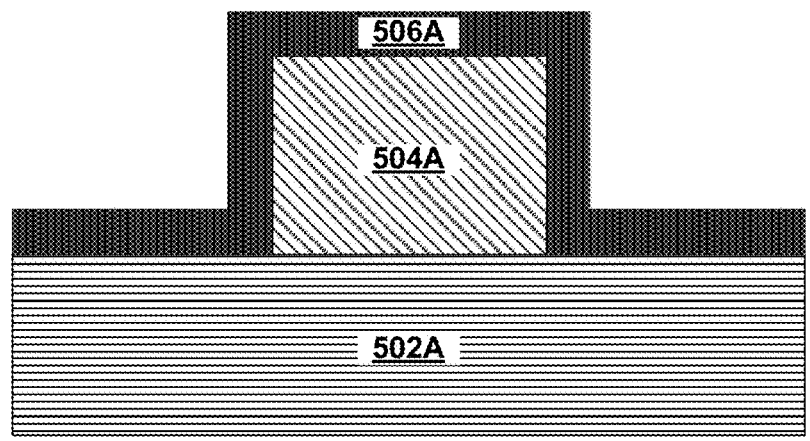
FIGS. 6 and 7 illustrate block diagrams for forming an alternative two-terminal memory according to another example embodiment.
Figure 6:
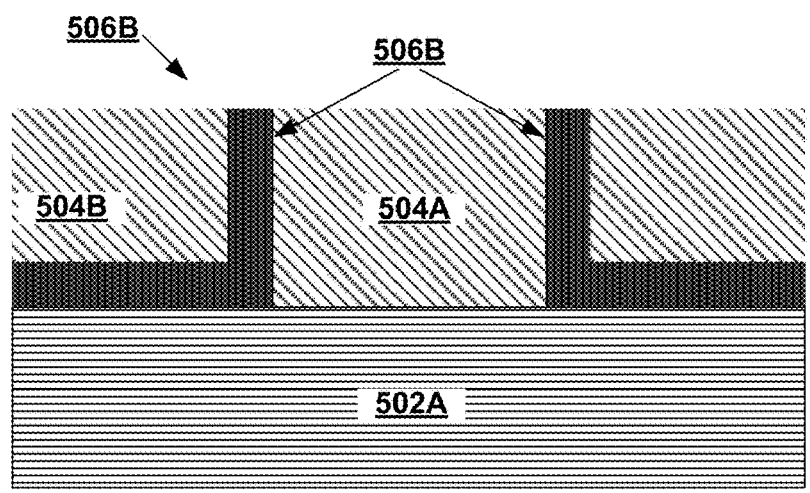
Figure 7:
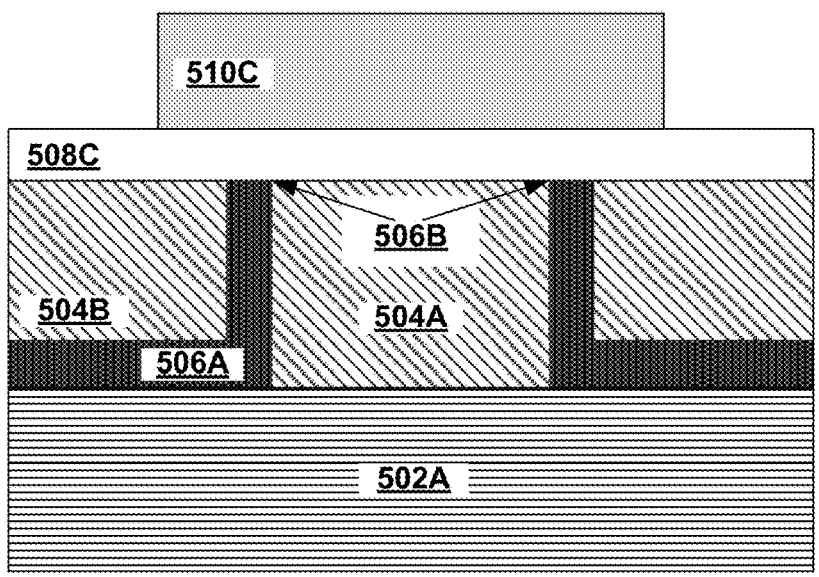

In at least one embodiment, second electrode 312 can be formed over a pillar device formed in oxide 308 (e.g., see FIGS. 6 and 7, infra). Second electrode 312 can comprise W, Ti, Cu, Al, Ag, Cu, Pt, Pd, Ta, Ni, Cr, a metal nitride (e.g., TiN, WN, TaN, and so forth), or the like, or a suitable combination of the foregoing. In one or more embodiments, switching layer 310 can comprise an a-Si, an amorphous SiGe, a semiconductor layer having intrinsic characteristics, a Si oxide, a Si sub-oxide (e.g., $SiO_B$ where B is a number between 0.1 and 2), a silicon derivative oxide (e.g., a silicon germanium oxide), a non-stoichiometric oxide, a metal oxide (e.g., zinc oxide), TiOx, AlOx, HfOx, SiOx, TaOx, CuOx, WOx, NbOx or NbOx (where x comprises a set of suitable numbers selected for respective ones of the foregoing compounds), or similar materials, or suitable combinations thereof. Moreover, first electrode 314 can comprise W, Ti, Cu, Al, Ag, Cu, Pt, Pd, Ta, Ni, Cr, a metal nitride (e.g., TiN, WN, TaN, etc.), or the like, or a suitable combination of the foregoing.

Figure 4:
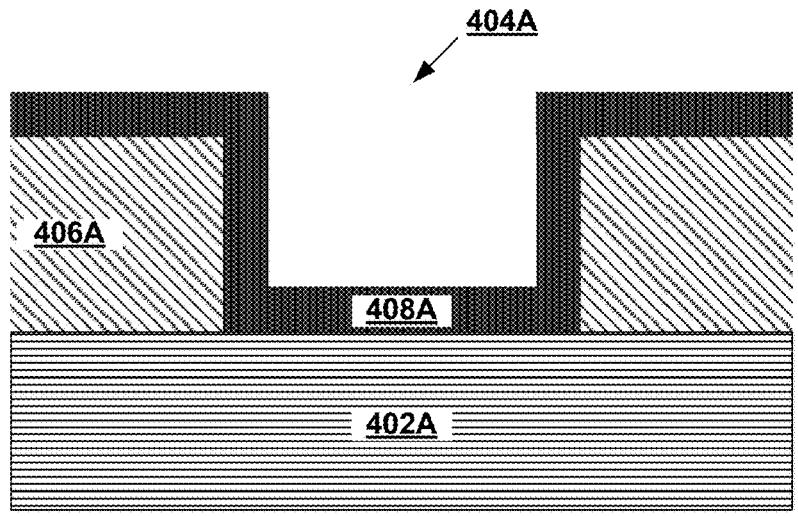
FIGS. 4 and 5 illustrate block diagrams for forming a two-terminal memory according to an example embodiment.
Figure 4:
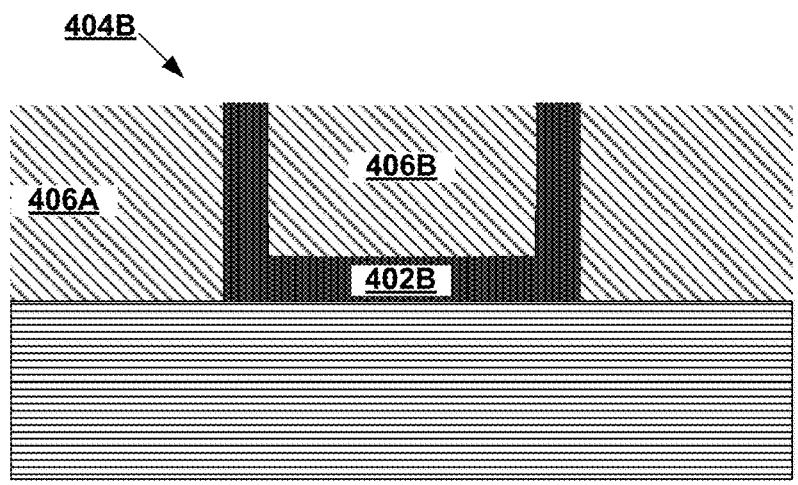
Figure 5:
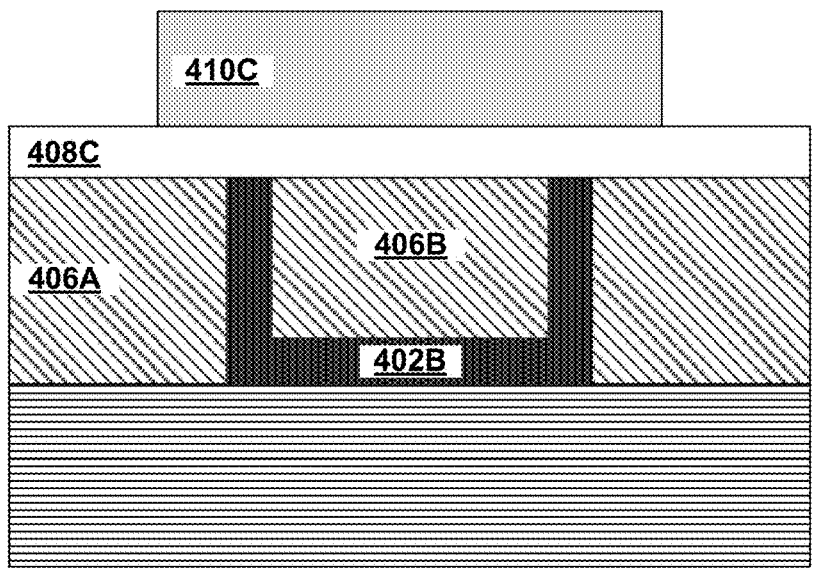

FIGS. 4 and 5 illustrate block diagrams of a memory device process 400 for fabricating a memory device, according to embodiments of the present disclosure. In some embodiments, memory device process 400 can provide a memory device such as memory device 100, or memory device 200. However, the subject disclosure is not so limited, and other variations on these memory devices could be provided by memory device process 400, in at least one embodiment.

Memory device process 400 can comprise a via etch, clean and deposition process 400A. Via etch, clean and deposition process 400A can comprise formation of an oxide layer 406A over a wiring electrode 402A. A via 404A can be etched within oxide layer 406A, forming a hole having an exposed surface(s) in oxide layer 406A. The hole can have a cross-section that is circular, or approximately circular, in some embodiments, ovoid, or approximately ovoid, in further embodiments, a polygon, or approximate polygon, in additional embodiments, or can another geometric shape or approximation of a geometric shape, or a non-geometric shape in additional embodiments. Further, although via 404A is depicted as having sharp edges at a top surface of oxide layer 406A and an intersection of oxide layer 406A and wiring electrode 402A, these edges can be curved in some embodiments, and the surface exposed by via 404A can have angled sides rather than pure vertical sides as depicted by FIG. 4. Additionally, via etch, clean and deposition process 400A can comprise formation of a conductive layer 408A over a top surface of oxide layer 406A, and an exposed surface(s) of oxide layer 406A formed by via 404A. In at least one disclosed embodiment(s), conductive layer 408A can be provided as a deposition (e.g., a deposition film), and can have a thickness selected from a range between about 1 nm and about 50 nm. The thickness can be selected to provide a target current density through conductive layer 408A, a target resistance, or the like.

Memory device process 400 can further comprise an oxide fill and polishing 400B. Oxide fill and polishing 400B can comprise filling a remainder of a hole formed by via 404A with oxide 406B. Oxide 406B can be substantially the same as oxide layer 406A, although the subject disclosure is not so limited. Following the oxide fill, a top surface of the memory device can be polished or smoothed down to a surface of oxide layer 406A, removing conductive layer 408A above a top surface of oxide layer 406A, leaving conductive electrode 402B having a top surface substantially even with a top surface of oxide layer 406A.

Referring to FIG. 5, memory device process 400 is continued. FIG. 5 illustrates a switching layer, top electrode deposition and pattern process 400C. A switching layer 408C is deposited over oxide layer 406A, second electrode 402B and oxide fill 406B. Switching layer 408C can have a thickness selected in a range from about 1 nm to about 50 nm, in one or more embodiments. In additional embodiments, a top electrode 410C can be deposited above switching layer 408C and patterned. The combination of top electrode 410C, switching layer 408C and second electrode 402B can form a resistive-switching memory cell, in one or more disclosed embodiments.

FIGS. 6 and 7 illustrate block diagrams of a memory device process 500 for fabricating a memory device according to alternative or additional embodiments of the present disclosure. Referring first to FIG. 6, at the top block diagram, there is depicted a pillar etch, clean and deposition process 500A. A first conductor 502A can be formed having an oxide (or other insulating material) layer formed thereon. Additionally, the oxide layer can be etched to create an oxide pillar 504A, as depicted. Although oxide pillar 504A is depicted as having sharp edges and side walls perpendicular to a top surface of first conductor 502A, it should be appreciated that the sharp edges could be rounded in some embodiments, and the side walls could be approximately perpendicular to the top surface of first conductor 502A, or non-perpendicular to the top surface in alternative embodiments. Further, a second conductor layer 506A can be deposited over oxide pillar 504A. Second conductor layer 506A can have a thickness selected from a range of about 1 nm to about 50 nm, in at least one embodiment.

The bottom block diagram of FIG. 6 depicts an oxide fill and polishing process 500B. Oxide fill and polishing process 500B can comprise providing an oxide material 504B over second conductor layer 506A. After providing oxide material 504B, a polishing process can be performed to provide a top surface 506B. Top surface 506B can be polished to remove a portion of conductor layer 506A over oxide pillar 504A, so that vertical portions 506B of conductor layer 506A are exposed even with or substantially even with a top surface of oxide pillar 504A, and oxide material 504B, in an embodiment.

Referring to FIG. 7, memory device process 500 is continued. A block diagram illustrates a switching layer, and top electrode deposition and pattern process 500C. A switching layer 508C can be deposited over top surfaces of vertical portions 506B of conductor layer 506A, oxide material 504B and oxide pillar 504A. Additionally, a metal layer can be formed over switching layer 508C, and patterned and etched to form a top electrode 510C. A combination of top electrode 510C, switching layer 508C and conductor layer 506A can form a resistive-switching memory device in one or more disclosed embodiments. In some embodiments, the two vertical portions 506B may be used to form two separate resistive-switching memory devices.

Figure 8:
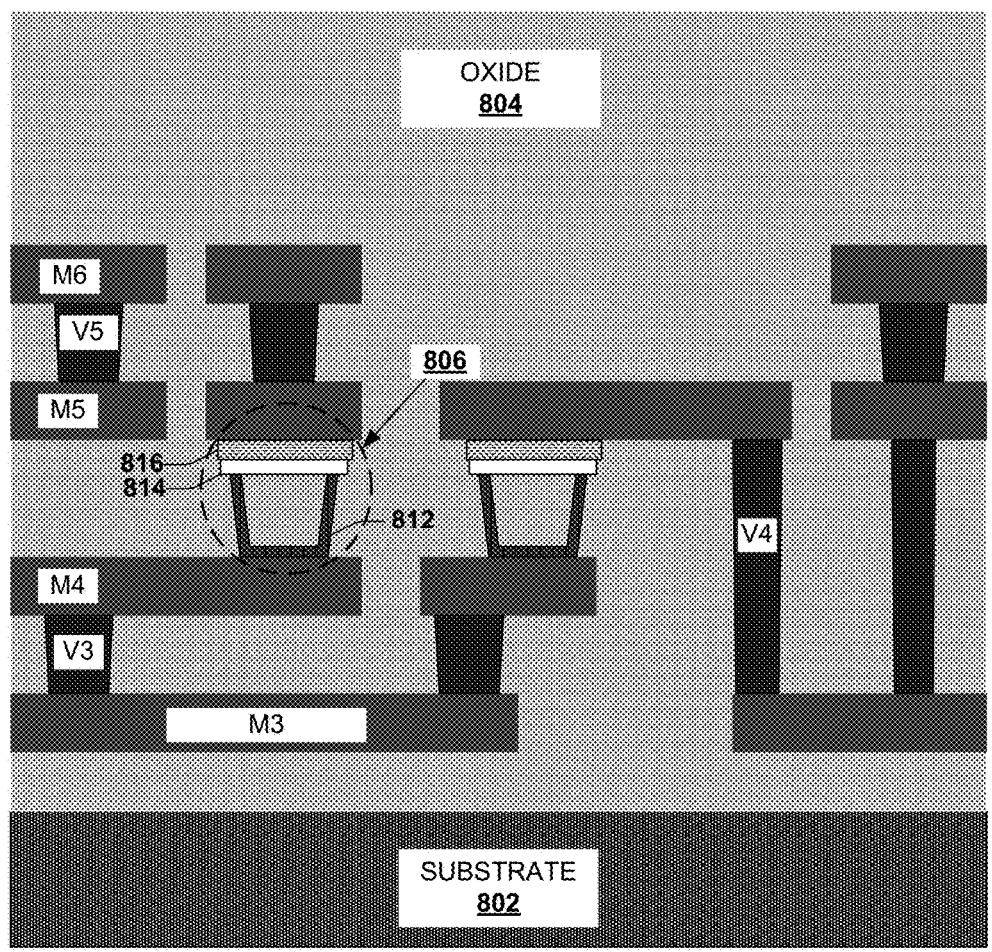
FIG. 8 depicts an example memory architecture comprising a two-terminal memory between back-end metal layers of the memory architecture.

FIG. 8 illustrates a block diagram of an example memory architecture 800 according to one or more further embodiments of the subject disclosure. Example memory architecture 800 can comprise a substrate 802. In some disclosed embodiments, substrate 802 can comprise control logic, including a passive component(s) or active component(s) of an electronic device. In at least one embodiment, substrate 802 and control logic can be fabricated at least in part with a front-end-of-line process(es).

An electrical insulator such as an oxide 804 or the like, can be provided over substrate 802. Additionally, one or more metal layers, including metal layer levels M3, M4, M5, M6 (up to an $X^{th}$ metal layer $M_X$, where X is a suitable integer, in some embodiments), can be formed within oxide 804. In some embodiments, the metal layers can be formed interspersed between multiple layers of oxide 804. Further, one or more conductive via layers can be formed between subsets of respective metal layers. The via layers can form one or more conductive vias, including via levels V3, V4, and V5.

In addition to the foregoing, a memory device 806 can be formed between pairs of metal layers, in an embodiment. For instance, memory device 806 can be formed between metal layers M3 and M4. However, in other embodiments, memory device 806 can be formed between metal layers M2 and M3, between metal layers M5 and M6, or between other pairs of metal layers (e.g., M3 and M5, etc.).

Memory device 806 can comprise a bottom electrode 812, having a bottom surface in electrical contact with a subset of metal layer M4, and can have a top surface with at least one discontinuity. For instance, the top surface of bottom electrode 812 can be in contact with a switching layer 814, with an oxide material within a perimeter of the top surface also in contact with switching layer 814. A surface area of the top surface of bottom electrode 812 can be selected to provide a target current density, resistance, or other electrical parameter for memory device 806. In at least one embodiment, a top electrode 816 can be formed in contact with switching layer 814 and a subset of metal layer M5. In an alternative embodiment, memory device can be formed without top electrode 816, and with switching layer 814 in contact with the subset of metal layer M5. In various embodiments, metal layers M3, M4, M5, M6, vias V3, V4, V5 or memory device 806 can be formed in part or in total with back-end-of-line fabrication processes.

Figure 9:
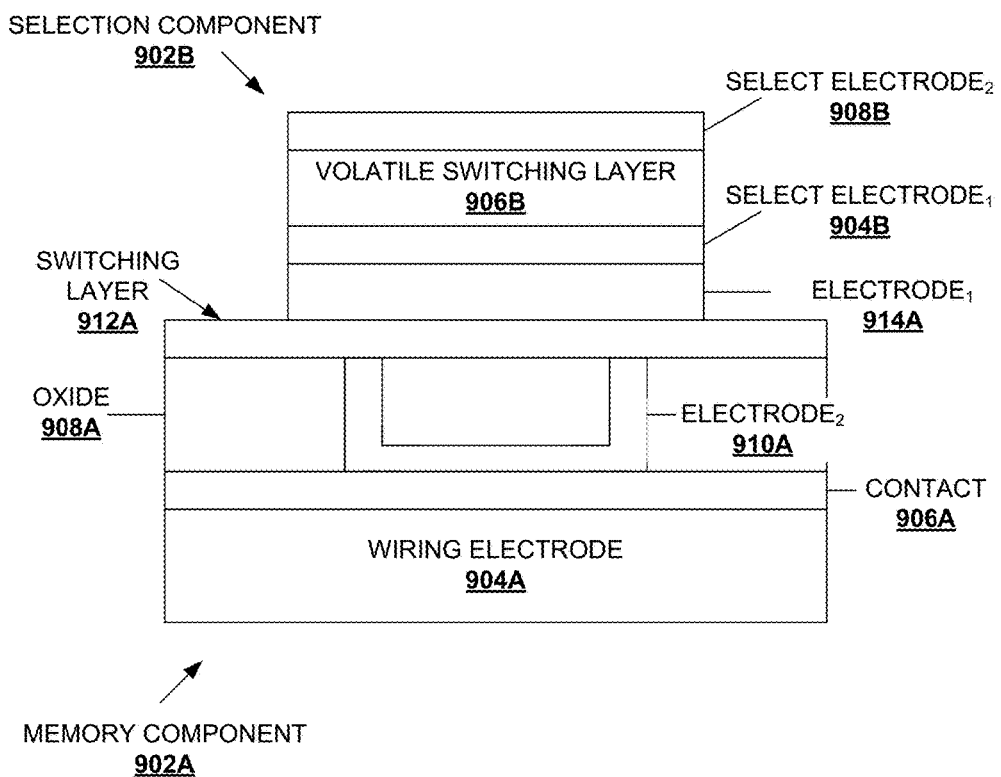
FIG. 9 illustrates a block diagram of an example two-terminal memory comprising a selector device in a further embodiment.

FIG. 9 illustrates a block diagram of an example memory device 900 according to alternative or additional embodiments of the present disclosure. Memory device 900 can comprise a memory component 902A in electrical series with a selection component 902B. Memory component 902A can comprise a wiring electrode 904A as a bottom layer. In one embodiment, a contact layer 906A can be formed above wiring electrode 904A, whereas in another embodiment memory component 902A can be devoid of contact layer 906A. Additionally, an oxide layer 908A can be formed above wiring electrode 904A, having an electrode, electrode$_2$ 910A formed therein. In various embodiments, electrode$_2$ 910A can comprise a discontinuity in a contact surface (e.g., a top surface, as depicted by FIG. 9, or in a bottom surface in an alternative embodiment) of electrode$_2$ 910A. Above oxide layer 908A is a switching layer 912A in electrical contact with a top surface of electrode$_2$ 910A. In one or more embodiments, switching layer 912A can be a non-volatile switching layer, configured to retain one of a set of measurably distinct states in absence of a suitable memory stimulus (e.g., an electric field, a voltage, a current, a joule heat, etc.) associated with causing switching layer 912A to have one of the set of measurably distinct states. Additionally, another electrode, electrode$_1$ 914A can be formed above switching layer 912A.

As depicted by memory device 900, selection component 902B can be formed above memory component 902A, in electrical series with memory component 902A. Selection component 902B can comprise a first selection electrode$_1$ 904B, a volatile switching layer 906B and a second selection electrode$_2$ 908B. In one or more embodiments, volatile switching layer 906B can have a plurality of states, including a deactivation state in the absence of an activation stimulus (e.g., activation voltage, activation current, etc.) applied to memory device 900, and an activation state in response to the activation stimulus being applied to memory device 900. Further, selection component 902B can be a bipolar switching device, in which a positive activation stimulus (e.g., a positive voltage, etc.) can cause volatile switching layer 906B to activate, and a negative activation stimulus (e.g., a negative voltage, and so on) can also cause volatile switching layer 906B to activate. Further, when deactivated, selection component 902B can mitigate or prevent the memory stimulus from affecting memory component 902A, and when activated, the memory stimulus can affect memory component 902A.

In at least one embodiment, first selection electrode$_1$ 904B can be an isolated electrode. Accordingly, first selection electrode$_1$ 904B can be unconnected from an external stimulus source (e.g., a power supply external to memory device 900). As such, first selection electrode$_1$ 904B can be obtain a charge, current, voltage, etc., induced by a stimulus applied to second selection electrode$_2$ 908B, electrode$_2$ 910A or wiring electrode 904A, for instance, to facilitate activation of volatile switching layer 906B. In absence of the stimulus applied to second selection electrode$_2$ 908B, electrode$_2$ 910A or wiring electrode 904A, first selection electrode$_1$ 904B can have a decreased charge, current, voltage, etc., or no such charge, current or voltage, facilitating deactivation of volatile switching layer 906B. In various embodiments, selection component 902B may be embodied as a selector device disclosed in U.S. Pat. App. No. 61/951,454 filed Mar. 11, 2014, incorporated by reference herein, for all purposes.

Figure 10:
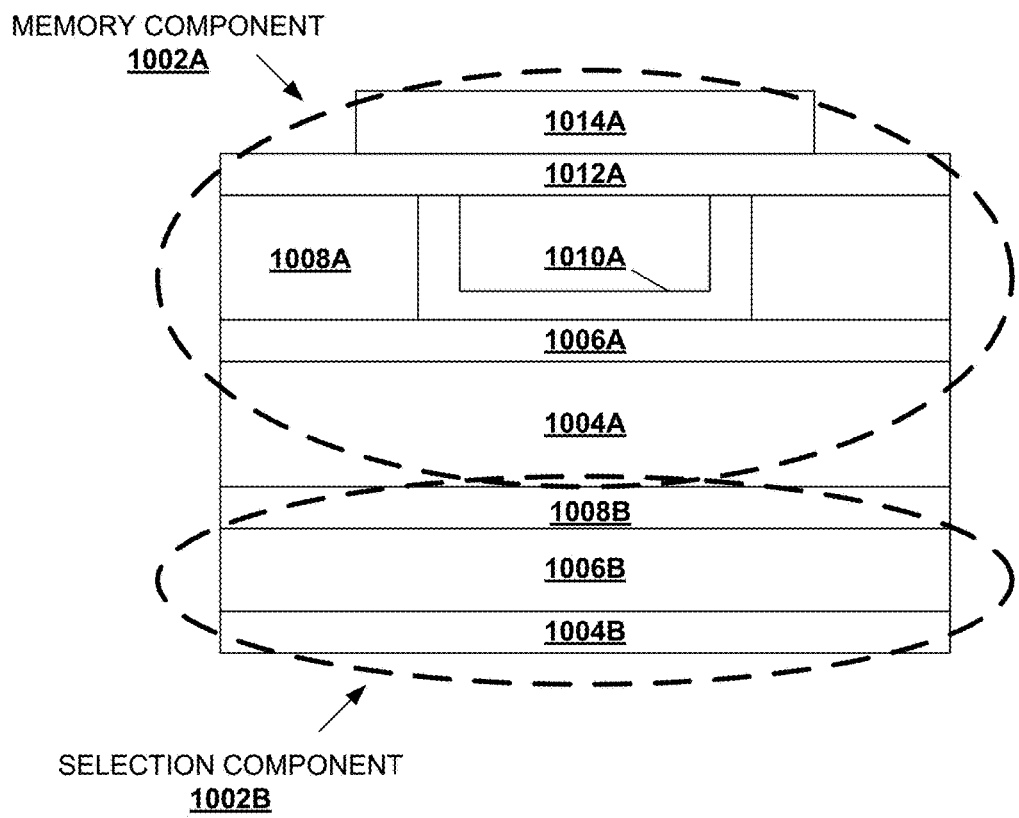
FIG. 10 depicts a block diagram of a sample two-terminal memory comprising a selector device in another embodiment.

FIG. 10 illustrates a block diagram of an alternative example memory device 1000 according to further embodiments of the present disclosure. As depicted, memory device 1000 can comprise a memory component 1002A above, and in electrical series with, a selection component 1002B. In at least one embodiment, memory component 1002A can be substantially similar to memory component 902A of FIG. 9, infra, or selection component 1002B can be substantially similar to selection component 902B. However, the subject disclosure is not so limited, and in additional embodiments memory component 1002A or selection component 1002B can differ from memory component 902A or selection component 902B, respectively.

Selection component 1002B can comprise a first selection electrode 1004B, in contact with a volatile switching device 1006B. Additionally, volatile switching device 1006B can be in contact with a second selection electrode 1008B. In at least one embodiment, second selection electrode 1008B can be oriented on an opposite side of volatile switching device 1006B from first selection electrode 1004B, although other orientations can be implemented in other embodiments.

Memory component 1002A is in electrical series with selection component 1002B, and can respond to an external memory stimulus in response to activation of selection component 1002B. Additionally, memory component 1002A can be non-responsive to the external memory stimulus in response to deactivation of selection component 1002B. As depicted, memory component 1002A can comprise a wiring layer 1004A. A contact layer 1006A can be provided in contact with wiring layer 1004A in one embodiment. Additionally, an oxide layer 1008A can comprise an electrode 1010A having a contact surface with at least one surface discontinuity. Although memory component 1002A illustrates the contact surface having the at least one discontinuity in a top surface of electrode 1010A, other embodiments can comprise the contact surface having the at least one discontinuity in a bottom surface of electrode 1010A. In at least one other embodiment, multiple contact surfaces can have respective surface discontinuities (e.g., a top surface with a surface discontinuity, and a bottom surface with a surface discontinuity). Additionally, memory component 1002A can comprise a non-volatile switching layer 1012A in electrical contact with electrode 1010A at a first surface of non-volatile switching layer 1012A. Further, a second electrode 1014A can be provided above and in contact with a second surface of non-volatile switching layer 1012A.

Figure 11:
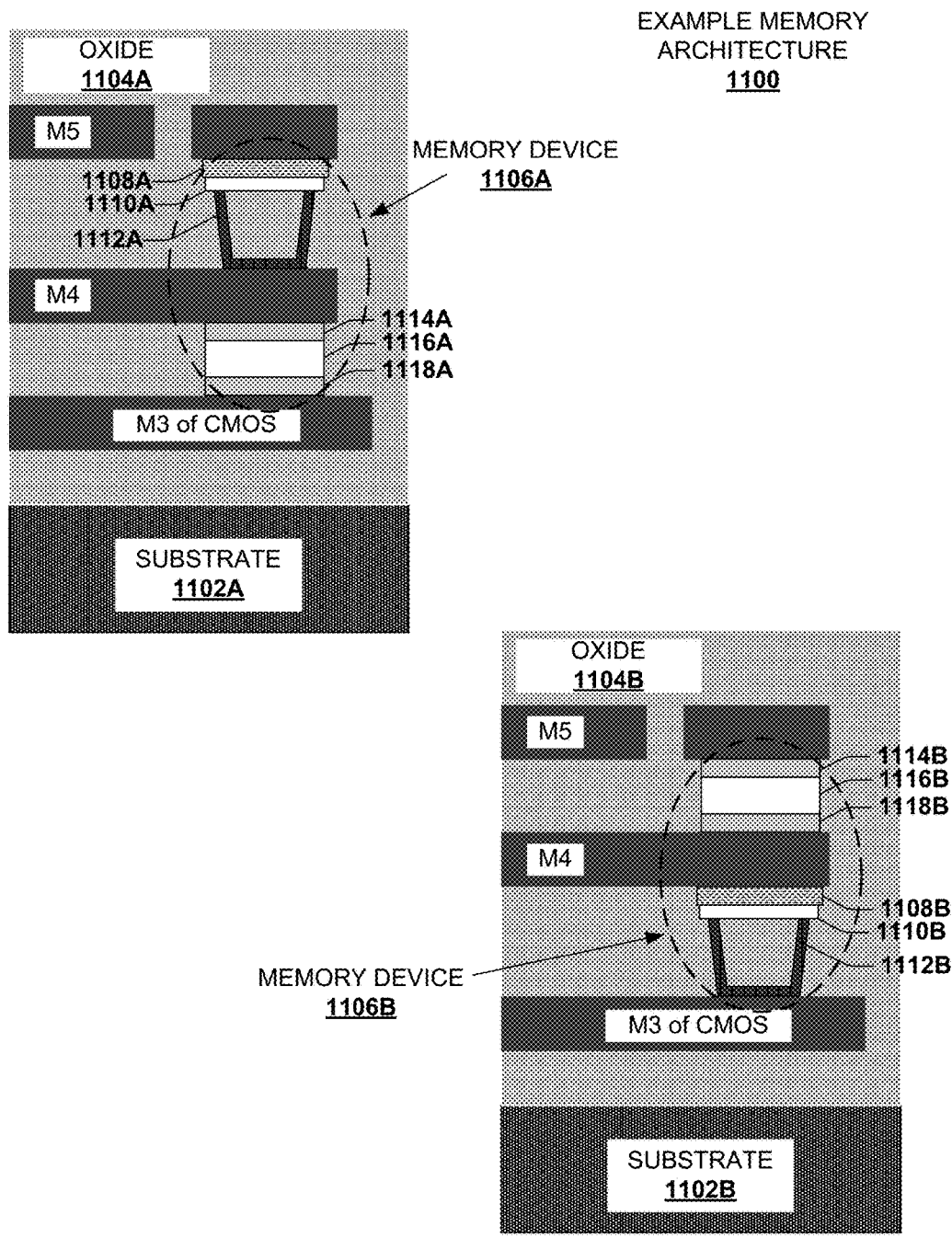
FIG. 11 illustrates a block diagram of an example memory architecture comprising a two-terminal memory and a selector device.

FIG. 11 depicts block diagrams of example memory architectures 1100 according to further disclosed embodiments. A first example architecture is depicted by the top block diagram. A substrate 1102A is provided, having multiple metal layers, M3, M4 and M5 within an electrical insulator, such as an oxide 1104A. A memory device 1106A is depicted in part between metal layers M3 and M4, and in part between metal layers M4 and M5. Memory device 1106A comprises a memory component situated between metal layers M4 and M5, comprising a first electrode 1112A having at least one contact surface with a surface discontinuity. Additionally, the memory component comprises a non-volatile switching layer 1110A in electrical contact with the contact surface having the surface discontinuity, and a second electrode 1108A in electrical contact with the non-volatile switching layer 1110A and a subset of metal layer M5. Further, memory device 1106A comprises a selection component situated between metal layers M3 and M4. For instance, the selection component can be in electrical contact with a subset of metal layer M4 that is also in electrical contact with the memory component of memory device 1106A. The selection component can comprise a stack of multiple layers having a first selection electrode 1114A, in contact with metal layer M4, a volatile switching layer 1116A, and a second selection electrode 1118A on contact with a subset of conductive layer M3.

A second example architecture is depicted by the bottom block diagram. Similar to the first example architecture, a substrate 1102B is provided having metal layers M3, M4 and M5 within an insulator material, such as an oxide 1104B. Further, a memory device 1106B is provided having a memory component between a subset of metal layer M3 and a subset of metal layer M4. The memory component can comprise a first electrode 1112B having at least one contact surface with a surface discontinuity, a non-volatile switching layer 1110B, and a second electrode 1108B in contact with the subset of metal layer M4. Further, a selection component is provided in contact with the subset of metal layer M4, and a subset of metal layer M5. The selection component can comprise a first selection electrode 1118B, a volatile switching layer 1116B and a second selection electrode 1114B in contact with the subset of the metal layer M5.

Figure 12:
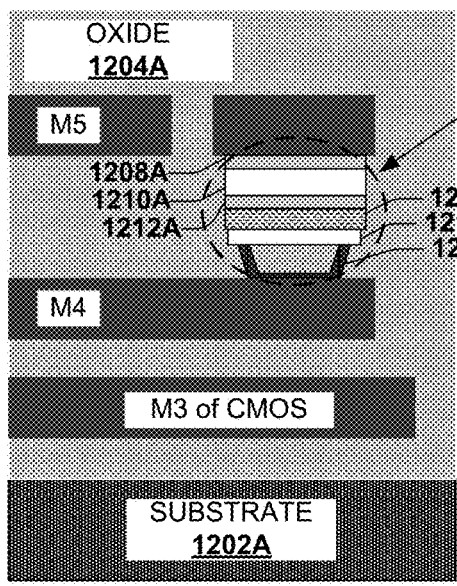
FIG. 12 depicts a block diagram of a sample memory architecture comprising a two-terminal memory and a selector device in another embodiment.
Figure 12:
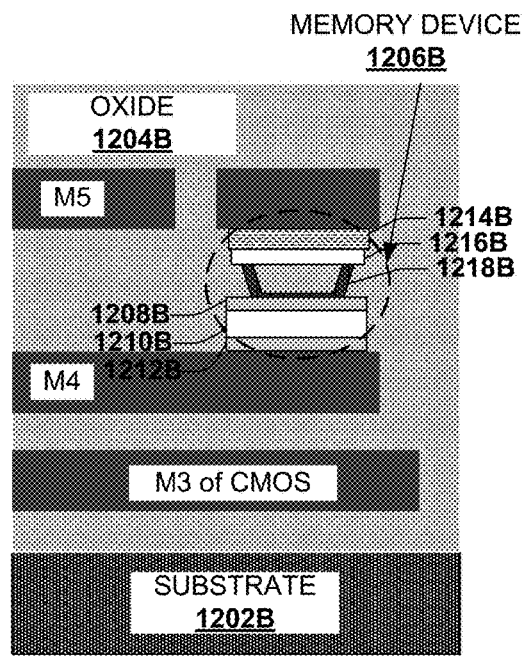

FIG. 12 illustrates block diagrams of an additional example memory architecture 1200 according to still other disclosed embodiments. A top block diagram illustrates a first memory device 1206A according to memory architecture 1200. A substrate 1202A is provided having at least two metal layers, including layers M3, M4 and M5 in the embodiment depicted, within an oxide 1204A. First memory device 1206A is situated between metal layers M4 and M5, although other arrangements are permitted in other embodiments. Memory device 1206A comprises a memory component, including a bottom electrode 1218A (having at least one contact surface with a surface discontinuity) in contact with a subset of metal layer M4, a non-volatile switching layer 1216A and a top electrode 1214A, beneath a selection component. The selection component comprises a first selection electrode 1212A, a volatile switching layer 1210A and a second selection electrode 1208A in contact with a subset of metal layer M5.

A bottom block diagram illustrates a second memory device 1206B according to memory architecture 1200. A substrate 1202B comprises at least two metal layers, M3, M4, M5, within an oxide 1204B on substrate 1202B. Second memory device 1206B comprises a selection component beneath a memory component, having a different orientation compared to first memory device 1206A. The selection component can comprise a first selection electrode 1212B in contact with a subset of metal layer M4, a volatile switching layer 1210B and a second selection electrode 1208B. The memory component can comprise a bottom electrode 1218B, having at least one contact surface comprising a surface discontinuity, in contact with second selection electrode 1208B. Additionally, the memory component can comprise a non-volatile switching layer 1216B, and a top electrode 1214B in contact with a subset of metal layer M5. Although second memory device 1206B is positioned between metal layers M4 and M5 in FIG. 12, positioning between other pairs of metal layers are within the scope of the subject disclosure according to alternative embodiments.

The aforementioned diagrams have been described with respect to interaction between several components (e.g., layers) of a memory cell, a metal layer thereof, or a memory architecture comprised of such memory cell/metal layer. It should be appreciated that in some suitable alternative aspects of the subject disclosure, such diagrams can include those components and layers specified therein, some of the specified components/layers, or additional components/layers. Sub-components can also be implemented as electrically connected to other sub-components rather than included within a parent component/layer. For example, an intermediary layer(s) can be instituted adjacent to one or more of the disclosed layers. As one example, a suitable barrier layer that mitigates or controls unintended oxidation can be positioned between one or more disclosed layers. In yet other embodiments, a disclosed memory stack or set of film layers can have fewer layers than depicted. For instance, a switching layer can electrically contact a metal wire directly, rather than having an electrode layer there between. Additionally, it is noted that one or more disclosed processes can be combined into a single process providing aggregate functionality. Components of the disclosed architectures can also interact with one or more other components not specifically described herein but known by those of skill in the art.

Figure 13:
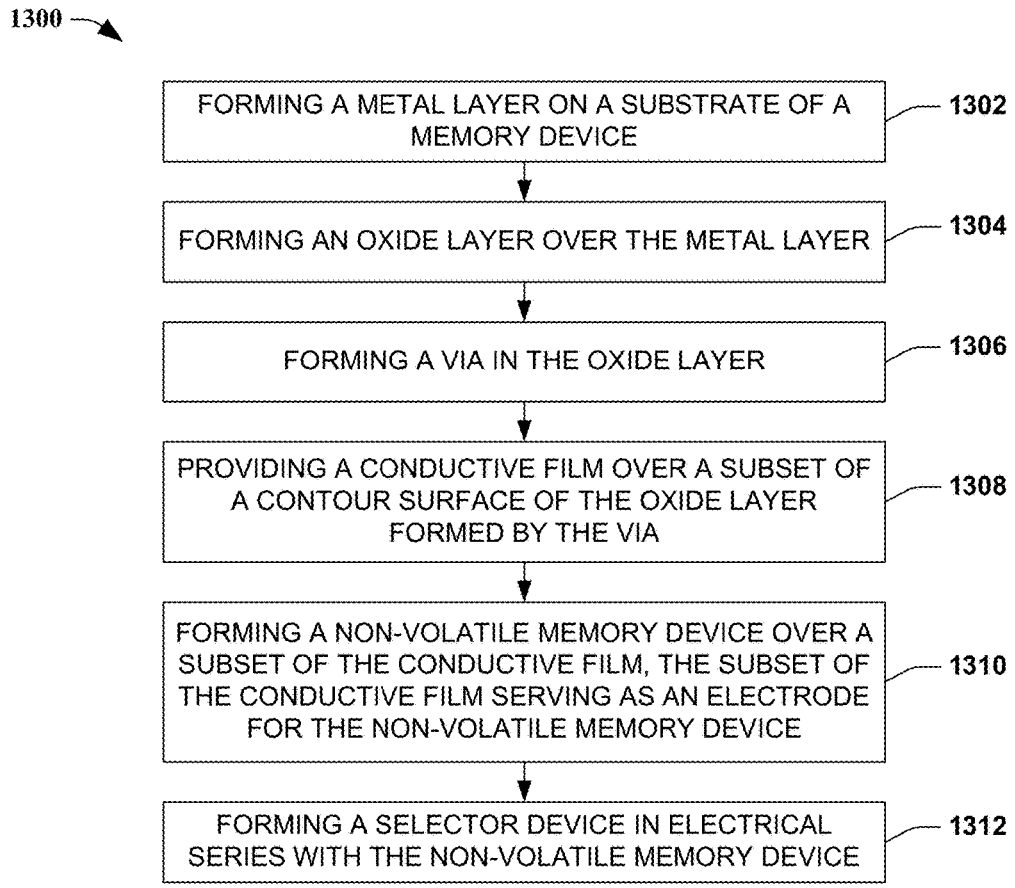
FIG. 13 illustrates a flowchart of an example method for fabricating a two-terminal memory according to embodiments of the present disclosure.
Figure 14:
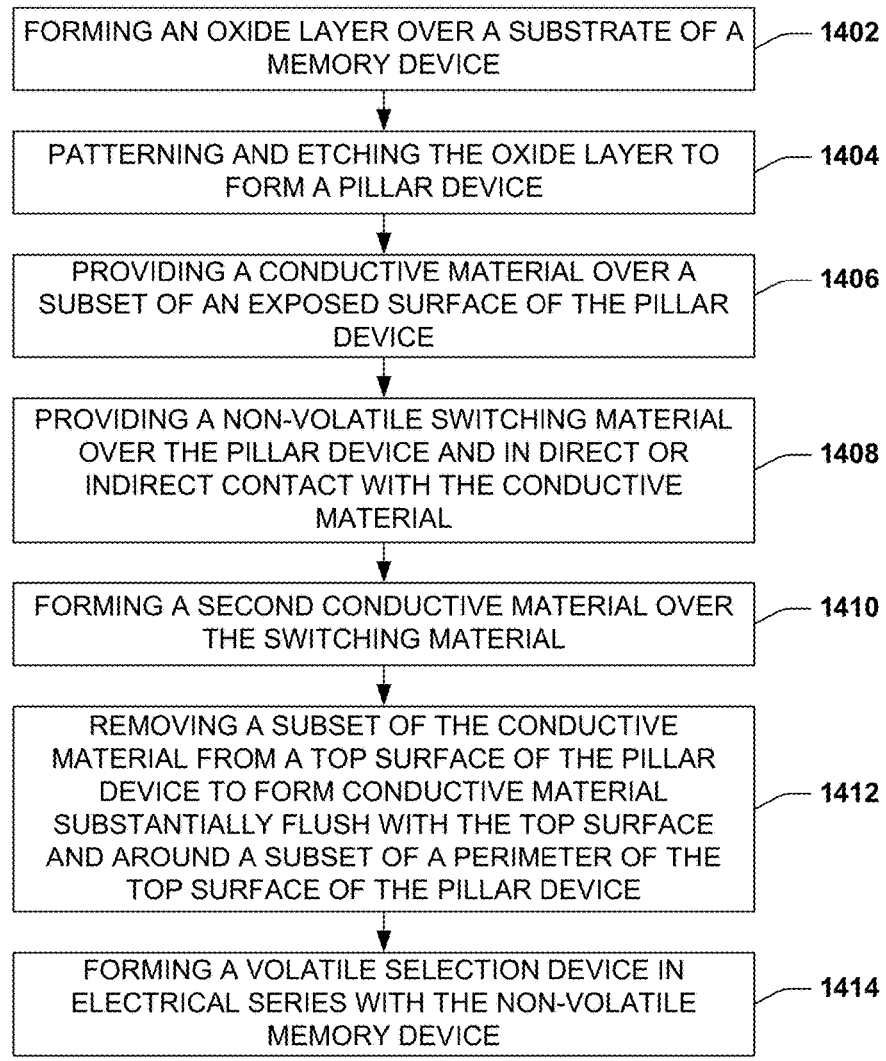
FIG. 14 depicts a flowchart of a sample method for fabricating a two-terminal memory according to one or more other disclosed embodiments.

In view of the exemplary diagrams described supra, process methods that can be implemented in accordance with the disclosed subject matter will be better appreciated with reference to the flow charts of FIGS. 13-14. While for purposes of simplicity of explanation, the methods of FIGS. 13-14 are shown and described as a series of blocks, it is to be understood and appreciated that the claimed subject matter is not limited by the order of the blocks, as some blocks may occur in different orders or concurrently with other blocks from what is depicted and described herein. Moreover, not all illustrated blocks are necessarily required to implement the methods described herein. Additionally, it should be further appreciated that some or all of the methods disclosed throughout this specification are capable of being stored on an article of manufacture to facilitate transporting and transferring such methodologies to an electronic device. The term article of manufacture, as used, is intended to encompass a computer program accessible from any computer-readable device, device in conjunction with a carrier, or storage medium.

FIG. 13 illustrates a flowchart of an example method 1300 for fabricating an electrode of a two-terminal memory device, according to additional embodiments of the subject disclosure. At 1302, method 1300 can comprise forming a conductive layer (e.g., a metal layer, a doped semiconductor layer, etc.) on a substrate of a memory device. At 1304, method 1300 can comprise forming an oxide layer over the metal layer. At 1306, method 1300 can comprise forming a via in the oxide layer. At 1308, method 1300 can comprise providing a conductive film over a subset of a contour surface of the oxide layer formed by the via. Additionally, at 1310, method 1300 can comprise forming a non-volatile memory device over a subset of the conductive film. In at least one embodiment, the subset of the conductive film can serve as an electrode for the non-volatile memory device. In at least one embodiment, at 1312, method 1300 can further comprise forming a selector device in electrical series with the non-volatile memory device.

In at least one embodiment, the via can have a cross-section in the oxide layer having a shape selected from a group consisting of: a circle, an approximation of a circle, an oval, an approximation of an oval, a polygon, and an approximation of a polygon. In an alternative or additional embodiment, the group can further comprise a non-geometric cross-section shape.

According to other embodiments, method 1300 can further comprise polishing the conductive film flush with or approximately flush with a top surface of the oxide layer. In still other embodiments, forming the selector device can comprise forming a volatile selector device electrically in series with the non-volatile memory device.

According to a further embodiment, method 1300 can comprise forming the volatile selector device in direct contact with the subset of the conductive film serving as the electrode for the non-volatile memory device. In another embodiment, method 1300 can comprise forming the volatile selector device in direct contact with a second electrode of the non-volatile memory device. In yet another embodiment, method 1300 can comprise forming a second conductive layer (e.g., a second metal layer, a second doped semiconductor layer, etc.) over the substrate of the memory device. In at least one alternative or additional embodiment, forming the volatile selector device in series with the non-volatile memory device comprises forming the volatile selector device on an opposite side of the second conductive layer from the non-volatile memory device.

FIG. 14 illustrates a flowchart of an example method 1400 for fabricating a two-terminal memory, according to further embodiments of the subject disclosure. At 1402, method 1400 can comprise forming an oxide layer over a substrate of a memory device. At 1404, method 1400 can comprise patterning and etching the oxide layer to form a pillar device. At 1406, method 1400 can comprise providing a conductive material over a subset of an exposed surface of the pillar device. Further, at 1408, method 1400 can comprise providing a non-volatile switching material over the pillar device and in direct contact or indirect contact with the conductive material. At 1410, method 1400 can comprise forming a second conductive material over the switching material. In an embodiment, method 1400 can comprise, at 1412, removing a subset of the conductive material from a top surface of the pillar device to form conductive material substantially flush with the top surface and around a subset of a perimeter of the top surface of the pillar device. In an alternative or additional embodiment, a combination of the conductive material over the subset of the exposed surface of the pillar device, the non-volatile switching material and the second conductive material form a non-volatile memory device. In a further embodiment, at 1414, method 1400 can comprise forming a volatile selection device in electrical series with the non-volatile memory device.

In various embodiments of the subject disclosure, disclosed memory or memory architectures can be employed as a standalone or integrated embedded memory device with a CPU or microcomputer. Some embodiments can be implemented, for instance, as part of a computer memory (e.g., random access memory, cache memory, read-only memory, storage memory, or the like). Other embodiments can be implemented, for instance, as a portable memory device. Examples of suitable portable memory devices can include removable memory, such as a secure digital (SD) card, a universal serial bus (USB) memory stick, a compact flash (CF) card, or the like, or suitable combinations of the foregoing. (See, e.g., FIGS. 15 and 16, infra).

NAND FLASH is employed for compact FLASH devices, USB devices, SD cards, solid state drives (SSDs), and storage class memory, as well as other form-factors. Although NAND has proven a successful technology in fueling the drive to scale down to smaller devices and higher chip densities over the past decade, as technology scaled down past 25 nanometer (nm) memory cell technology, several structural, performance, and reliability problems became evident. A subset of these or similar considerations are addressed by the disclosed aspects.

Figure 15:
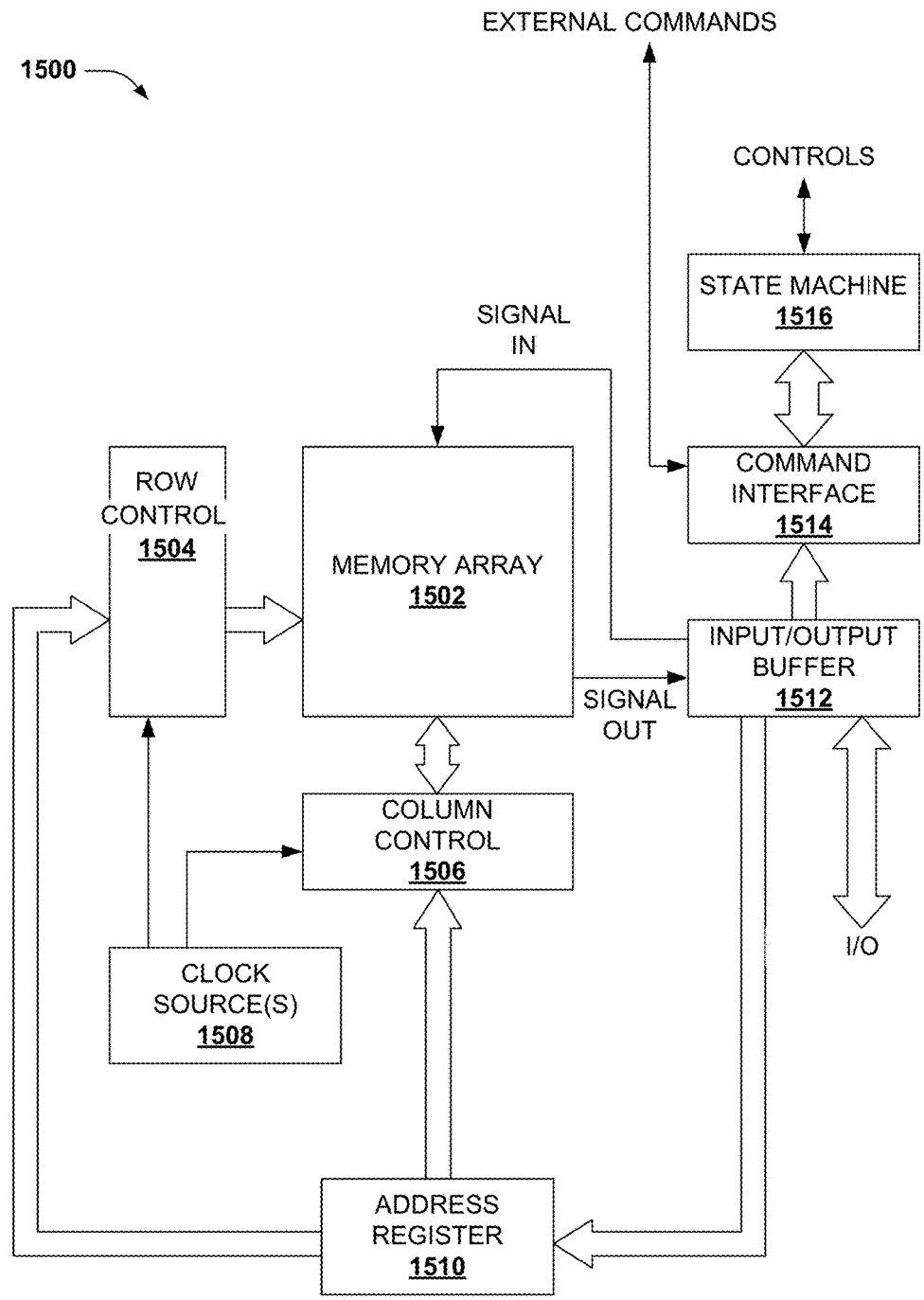
FIG. 15 depicts a block diagram of a sample operating and control environment for a memory device according to various disclosed embodiments.

In order to provide a context for the various aspects of the disclosed subject matter, FIG. 15, as well as the following discussion, is intended to provide a brief, general description of a suitable environment in which various aspects of the disclosed subject matter can be implemented or processed. While the subject matter has been described above in the general context of solid state memory and semiconductor architectures and process methodologies for fabricating and operating such memory or architectures, those skilled in the art will recognize that the subject disclosure also can be implemented in combination with other architectures or process methodologies. Moreover, those skilled in the art will appreciate that the disclosed processes can be practiced with a processing system or a computer processor, either alone or in conjunction with a host computer (e.g., computer 1602 of FIG. 16, infra), which can include single-processor or multiprocessor computer systems, mini-computing devices, mainframe computers, as well as personal computers, hand-held computing devices (e.g., PDA, smart phone, watch), microprocessor-based or programmable consumer or industrial electronics, and the like. The illustrated aspects may also be practiced in distributed computing environments where tasks are performed by remote processing devices that are linked through a communications network. However, some, if not all aspects of the subject innovation can be practiced on stand-alone electronic devices, such as a memory card, Flash memory module, removable memory, or the like. In a distributed computing environment, program modules can be located in both local and remote memory storage modules or devices.

FIG. 15 illustrates a block diagram of an example operating and control environment 1500 for a memory cell array 1502 according to aspects of the subject disclosure. In at least one aspect of the subject disclosure, memory cell array 1502 can comprise a variety of memory cell technology. In at least one embodiment, memory cells of the memory cell technology can comprise two-terminal memory having at least one electrode with at least one contact surface having a surface discontinuity(ies), arranged in a compact two or three dimensional architecture, as described herein. In another embodiment, memory cell array 1502 can store operations configured to cause a device to fabricate a two-terminal memory cell electrically in series with a selector device.

A column controller 1506 can be formed adjacent to memory cell array 1502. Moreover, column controller 1506 can be electrically coupled with bit lines of memory cell array 1502. Column controller 1506 can control respective bitlines, applying suitable program, erase or read voltages to selected bitlines.

In addition, operating and control environment 1500 can comprise a row controller 1504. Row controller 1504 can be formed adjacent to column controller 1506, and electrically connected with word lines of memory cell array 1502. Row controller 1504 can select particular rows of memory cells with a suitable selection voltage. Moreover, row controller 1504 can facilitate program, erase or read operations by applying suitable voltages at selected word lines.

A clock source(s) 1508 can provide respective clock pulses to facilitate timing for read, write, and program operations of row controller 1504 and column controller 1506. Clock source(s) 1508 can further facilitate selection of word lines or bit lines in response to external or internal commands received by operating and control environment 1500. An input/output buffer 1512 can be connected to an external host apparatus, such as a computer or other processing device (not depicted, but see e.g., computer 1602 of FIG. 16, infra) by way of an I/O buffer or other I/O communication interface. Input/output buffer 1512 can be configured to receive write data, receive an erase instruction, output readout data, and receive address data and command data, as well as address data for respective instructions. Address data can be transferred to row controller 1504 and column controller 1506 by an address register 1510. In addition, input data is transmitted to memory cell array 1502 via signal input lines, and output data is received from memory cell array 1502 via signal output lines. Input data can be received from the host apparatus, and output data can be delivered to the host apparatus via the I/O buffer.

Commands received from the host apparatus can be provided to a command interface 1514. Command interface 1514 can be configured to receive external control signals from the host apparatus, and determine whether data input to the input/output buffer 1512 is write data, a command, or an address. Input commands can be transferred to a state machine 1516.

State machine 1516 can be configured to manage programming and reprogramming of memory cell array 1502. State machine 1516 receives commands from the host apparatus via input/output buffer 1512 and command interface 1514, and manages read, write, erase, data input, data output, and similar functionality associated with memory cell array 1502. In some aspects, state machine 1516 can send and receive acknowledgments and negative acknowledgments regarding successful receipt or execution of various commands.

To implement read, write, erase, input, output, etc., functionality, state machine 1516 can control clock source(s) 1508. Control of clock source(s) 1508 can cause output pulses configured to facilitate row controller 1504 and column controller 1506 implementing the particular functionality. Output pulses can be transferred to selected bit lines by column controller 1506, for instance, or word lines by row controller 1504, for instance.

In connection with FIG. 16, the systems and processes described below can be embodied within hardware, such as a single integrated circuit (IC) chip, multiple ICs, an application specific integrated circuit (ASIC), or the like. Further, the order in which some or all of the process blocks appear in each process should not be deemed limiting. Rather, it should be understood that some of the process blocks can be executed in a variety of orders, not all of which may be explicitly illustrated herein.

Figure 16:
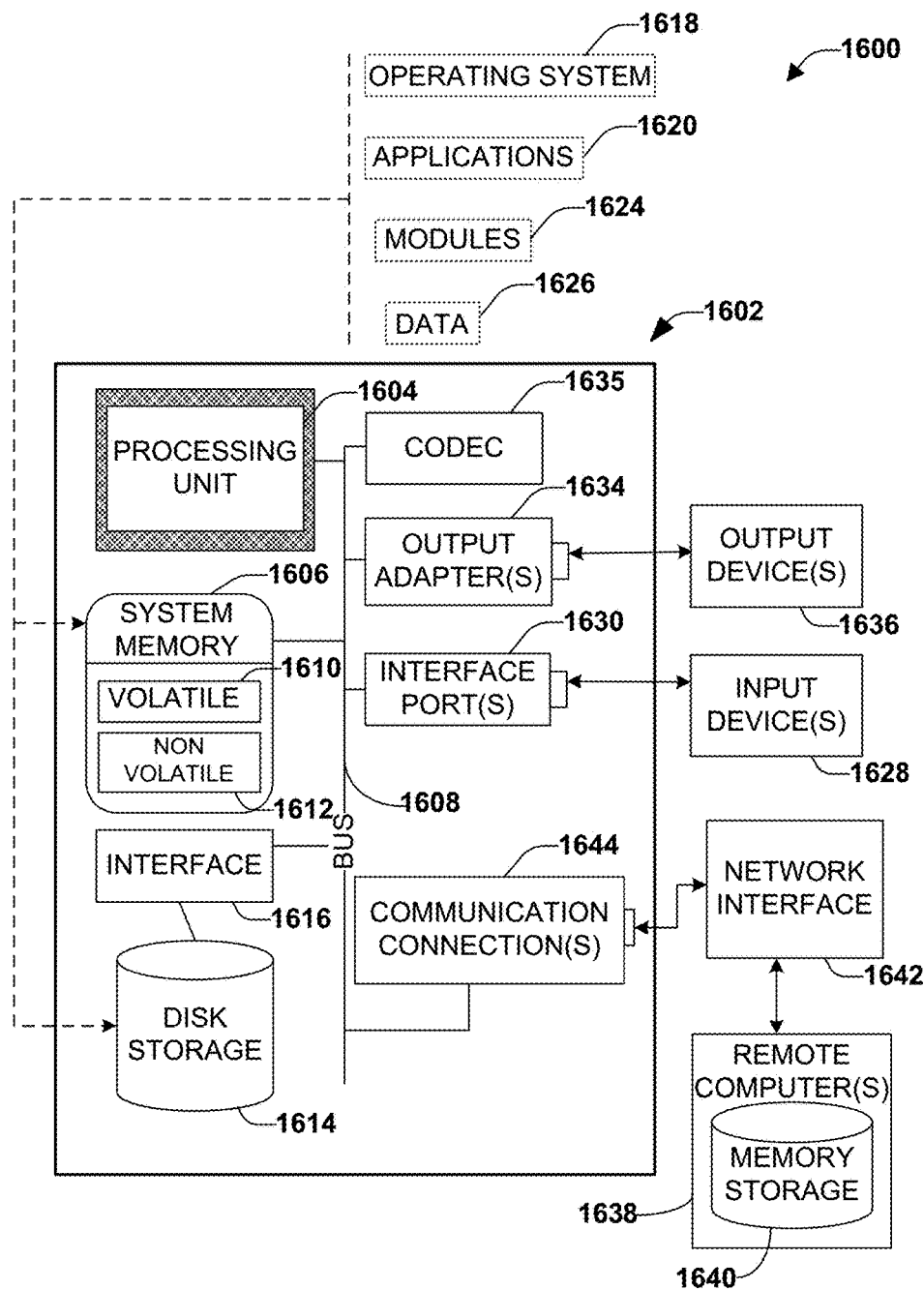
FIG. 16 illustrates a block diagram of an example computing environment that can be implemented in conjunction with various embodiments.

With reference to FIG. 16, a suitable operating environment 1600 for implementing various aspects of the claimed subject matter includes a computer 1602. The computer 1602 includes a processing unit 1604, a system memory 1606, a codec 1635, and a system bus 1608. The system bus 1608 couples system components including, but not limited to, the system memory 1606 to the processing unit 1604. The processing unit 1604 can be any of various available processors. Dual microprocessors and other multiprocessor architectures also can be employed as the processing unit 1604.

The system bus 1608 can be any of several types of bus structure(s) including the memory bus or memory controller, a peripheral bus or external bus, and/or a local bus using any variety of available bus architectures including, but not limited to, Industrial Standard Architecture (ISA), Micro-Channel Architecture (MSA), Extended ISA (EISA), Intelligent Drive Electronics (IDE), VESA Local Bus (VLB), Peripheral Component Interconnect (PCI), Card Bus, Universal Serial Bus (USB), Advanced Graphics Port (AGP), Personal Computer Memory Card International Association bus (PCMCIA), Firewire (IEEE 1394), and Small Computer Systems Interface (SCSI).

The system memory 1606 includes volatile memory 1610 and non-volatile memory 1614, which can employ one or more of the disclosed memory architectures, in various embodiments. The basic input/output system (BIOS), containing the basic routines to transfer information between elements within the computer 1602, such as during start-up, is stored in non-volatile memory 1612. In addition, according to present innovations, codec 1635 may include at least one of an encoder or decoder, wherein the at least one of an encoder or decoder may consist of hardware, software, or a combination of hardware and software. Although, codec 1635 is depicted as a separate component, codec 1635 may be contained within non-volatile memory 1612. By way of illustration, and not limitation, non-volatile memory 1612 can include read only memory (ROM), programmable ROM (PROM), electrically programmable ROM (EPROM), electrically erasable programmable ROM (EEPROM), or Flash memory. Non-volatile memory 1612 can employ one or more of the disclosed memory architectures, in at least some disclosed embodiments. Moreover, non-volatile memory 1612 can be computer memory (e.g., physically integrated with computer 1602 or a mainboard thereof), or removable memory. Examples of suitable removable memory with which disclosed embodiments can be implemented can include a secure digital (SD) card, a compact Flash (CF) card, a universal serial bus (USB) memory stick, or the like. Volatile memory 1610 includes random access memory (RAM), which acts as external cache memory, and can also employ one or more disclosed memory architectures in various embodiments. By way of illustration and not limitation, RAM is available in many forms such as static RAM (SRAM), dynamic RAM (DRAM), synchronous DRAM (SDRAM), double data rate SDRAM (DDR SDRAM), and enhanced SDRAM (ESDRAM), and so forth.

Computer 1602 may also include removable/non-removable, volatile/non-volatile computer storage medium. FIG. 16 illustrates, for example, disk storage 1614. Disk storage 1614 includes, but is not limited to, devices such as a magnetic disk drive, solid state disk (SSD) floppy disk drive, tape drive, Jaz drive, Zip drive, LS-100 drive, flash memory card, or memory stick. In addition, disk storage 1614 can include storage medium separately or in combination with other storage medium including, but not limited to, an optical disk drive such as a compact disk ROM device (CD-ROM), CD recordable drive (CD-R Drive), CD rewritable drive (CD-RW Drive) or a digital versatile disk ROM drive (DVD-ROM). To facilitate connection of the disk storage 1614 to the system bus 1608, a removable or non-removable interface is typically used, such as interface 1616. It is appreciated that disk storage 1614 can store information related to a user. Such information might be stored at or provided to a server or to an application running on a user device. In one embodiment, the user can be notified (e.g., by way of output device(s) 1636) of the types of information that are stored to disk storage 1614 and/or transmitted to the server or application. The user can be provided the opportunity to opt-in or opt-out of having such information collected and/or shared with the server or application (e.g., by way of input from input device(s) 1628).

It is to be appreciated that FIG. 16 describes software that acts as an intermediary between users and the basic computer resources described in the suitable operating environment 1600. Such software includes an operating system 1618. Operating system 1618, which can be stored on disk storage 1614, acts to control and allocate resources of the computer 1602. Applications 1620 take advantage of the management of resources by operating system 1618 through program modules 1624, and program data 1626, such as the boot/shutdown transaction table and the like, stored either in system memory 1606 or on disk storage 1614. It is to be appreciated that the claimed subject matter can be implemented with various operating systems or combinations of operating systems.

A user enters commands or information into the computer 1602 through input device(s) 1628. Input devices 1628 include, but are not limited to, a pointing device such as a mouse, trackball, stylus, touch pad, keyboard, microphone, joystick, game pad, satellite dish, scanner, TV tuner card, digital camera, digital video camera, web camera, and the like. These and other input devices connect to the processing unit 1604 through the system bus 1608 via interface port(s) 1630. Interface port(s) 1630 include, for example, a serial port, a parallel port, a game port, and a universal serial bus (USB). Output device(s) 1636 use some of the same type of ports as input device(s) 1628. Thus, for example, a USB port may be used to provide input to computer 1602 and to output information from computer 1602 to an output device 1636. Output adapter 1634 is provided to illustrate that there are some output devices, such as monitors, speakers, and printers, among other output devices, which require special adapters. The output adapter 1634 can include, by way of illustration and not limitation, video and sound cards that provide a means of connection between the output device 1636 and the system bus 1608. It should be noted that other devices and/or systems of devices provide both input and output capabilities such as remote computer(s) 1638.

Computer 1602 can operate in a networked environment using logical connections to one or more remote computers, such as remote computer(s) 1638. The remote computer(s) 1638 can be a personal computer, a server, a router, a network PC, a workstation, a microprocessor based appliance, a peer device, a smart phone, a tablet, or other network node, and typically includes many of the elements described relative to computer 1602. For purposes of brevity, only a memory storage device 1640 is illustrated with remote computer(s) 1638. Remote computer(s) 1638 is logically connected to computer 1602 through a network interface 1642 and then connected via communication connection(s) 1644. Network interface 1642 encompasses wire and/or wireless communication networks such as local-area networks (LAN) and wide-area networks (WAN) and cellular networks. LAN technologies include Fiber Distributed Data Interface (FDDI), Copper Distributed Data Interface (CDDI), Ethernet, Token Ring and the like. WAN technologies include, but are not limited to, point-to-point links, circuit switching networks such as Integrated Services Digital Networks (ISDN) and variations thereon, packet switching networks, and Digital Subscriber Lines (DSL).

Communication connection(s) 1644 refers to the hardware/software employed to connect the network interface 1642 to the system bus 1608. While communication connection 1644 is shown for illustrative clarity inside computer 1602, it can also be external to computer 1602. The hardware/software necessary for connection to the network interface 1642 includes, for exemplary purposes only, internal and external technologies such as, modems including regular telephone grade modems, cable modems and DSL modems, ISDN adapters, and wired and wireless Ethernet cards, hubs, and routers.

The illustrated aspects of the disclosure may also be practiced in distributed computing environments where certain tasks are performed by remote processing devices that are linked through a communications network. In a distributed computing environment, program modules or stored information, instructions, or the like can be located in local or remote memory storage devices.

Moreover, it is to be appreciated that various components described herein can include electrical circuit(s) that can include components and circuitry elements of suitable value in order to implement the embodiments of the subject disclosure. Furthermore, it can be appreciated that many of the various components can be implemented on one or more IC chips. For example, in one embodiment, a set of components can be implemented in a single IC chip. In other embodiments, one or more of respective components are fabricated or implemented on separate IC chips.

As utilized herein, terms "component," "system," "architecture" and the like are intended to refer to a computer or electronic-related entity, either hardware, a combination of hardware and software, software (e.g., in execution), or firmware. For example, a component can be one or more transistors, a memory cell, an arrangement of transistors or memory cells, a gate array, a programmable gate array, an application specific integrated circuit, a controller, a processor, a process running on the processor, an object, executable, program or application accessing or interfacing with semiconductor memory, a computer, or the like, or a suitable combination thereof. The component can include erasable programming (e.g., process instructions at least in part stored in erasable memory) or hard programming (e.g., process instructions burned into non-erasable memory at manufacture).

By way of illustration, both a process executed from memory and the processor can be a component. As another example, an architecture can include an arrangement of electronic hardware (e.g., parallel or serial transistors), processing instructions and a processor, which implement the processing instructions in a manner suitable to the arrangement of electronic hardware. In addition, an architecture can include a single component (e.g., a transistor, a gate array, . . . ) or an arrangement of components (e.g., a series or parallel arrangement of transistors, a gate array connected with program circuitry, power leads, electrical ground, input signal lines and output signal lines, and so on). A system can include one or more components as well as one or more architectures. One example system can include a switching block architecture comprising crossed input/output lines and pass gate transistors, as well as power source(s), signal generator(s), communication bus(ses), controllers, I/O interface, address registers, and so on. It is to be appreciated that some overlap in definitions is anticipated, and an architecture or a system can be a stand-alone component, or a component of another architecture, system, etc.

In addition to the foregoing, the disclosed subject matter can be implemented as a method, apparatus, or article of manufacture using typical manufacturing, programming or engineering techniques to produce hardware, firmware, software, or any suitable combination thereof to control an electronic device to implement the disclosed subject matter. The terms "apparatus" and "article of manufacture" where used herein are intended to encompass an electronic device, a semiconductor device, a computer, or a computer program accessible from any computer-readable device, carrier, or media. Computer-readable media can include hardware media, or software media. In addition, the media can include non-transitory media, or transport media. In one example, non-transitory media can include computer readable hardware media. Specific examples of computer readable hardware media can include but are not limited to magnetic storage devices (e.g., hard disk, floppy disk, magnetic strips . . . ), optical disks (e.g., compact disk (CD), digital versatile disk (DVD) . . . ), smart cards, and flash memory devices (e.g., card, stick, key drive . . . ). Computer-readable transport media can include carrier waves, or the like. Of course, those skilled in the art will recognize many modifications can be made to this configuration without departing from the scope or spirit of the disclosed subject matter.

What has been described above includes examples of the subject innovation. It is, of course, not possible to describe every conceivable combination of components or methodologies for purposes of describing the subject innovation, but one of ordinary skill in the art can recognize that many further combinations and permutations of the subject innovation are possible. Accordingly, the disclosed subject matter is intended to embrace all such alterations, modifications and variations that fall within the spirit and scope of the disclosure. Furthermore, to the extent that a term "includes", "including", "has" or "having" and variants thereof is used in either the detailed description or the claims, such term is intended to be inclusive in a manner similar to the term "comprising" as "comprising" is interpreted when employed as a transitional word in a claim.

Moreover, the word "exemplary" is used herein to mean serving as an example, instance, or illustration. Any aspect or design described herein as "exemplary" is not necessarily to be construed as preferred or advantageous over other aspects or designs. Rather, use of the word exemplary is intended to present concepts in a concrete fashion. As used in this application, the term "or" is intended to mean an inclusive "or" rather than an exclusive "or". That is, unless specified otherwise, or clear from context, "X employs A or B" is intended to mean any of the natural inclusive permutations. That is, if X employs A; X employs B; or X employs both A and B, then "X employs A or B" is satisfied under any of the foregoing instances. In addition, the articles "a" and "an" as used in this application and the appended claims should generally be construed to mean "one or more" unless specified otherwise or clear from context to be directed to a singular form.

Additionally, some portions of the detailed description have been presented in terms of algorithms or process operations on data bits within electronic memory. These process descriptions or representations are mechanisms employed by those cognizant in the art to effectively convey the substance of their work to others equally skilled. A process is here, generally, conceived to be a self-consistent sequence of acts leading to a desired result. The acts are those requiring physical manipulations of physical quantities. Typically, though not necessarily, these quantities take the form of electrical and/or magnetic signals capable of being stored, transferred, combined, compared, and/or otherwise manipulated.

It has proven convenient, principally for reasons of common usage, to refer to these signals as bits, values, elements, symbols, characters, terms, numbers, or the like. It should be borne in mind, however, that all of these and similar terms are to be associated with the appropriate physical quantities and are merely convenient labels applied to these quantities. Unless specifically stated otherwise or apparent from the foregoing discussion, it is appreciated that throughout the disclosed subject matter, discussions utilizing terms such as processing, computing, replicating, mimicking, determining, or transmitting, and the like, refer to the action and processes of processing systems, and/or similar consumer or industrial electronic devices or machines, that manipulate or transform data or signals represented as physical (electrical or electronic) quantities within the circuits, registers or memories of the electronic device(s), into other data or signals similarly represented as physical quantities within the machine or computer system memories or registers or other such information storage, transmission and/or display devices.

In regard to the various functions performed by the above described components, architectures, circuits, processes and the like, the terms (including a reference to a "means") used to describe such components are intended to correspond, unless otherwise indicated, to any component which performs the specified function of the described component (e.g., a functional equivalent), even though not structurally equivalent to the disclosed structure, which performs the function in the herein illustrated exemplary aspects of the embodiments. In addition, while a particular feature may have been disclosed with respect to only one of several implementations, such feature may be combined with one or more other features of the other implementations as may be desired and advantageous for any given or particular application. It will also be recognized that the embodiments include a system as well as a computer-readable medium having computer-executable instructions for performing the acts and/or events of the various processes.

What is claimed is:

1. A method of fabricating a memory device, comprising:
providing a substrate comprising a control logic device formed within the substrate;
forming a back-end-of-line metal layer overlying the substrate and the control logic of the memory device;
forming an oxide layer over the back-end-of-line metal layer;
forming a via in the oxide layer exposing a top surface of the back-end-of-line metal layer;
providing a conductive film over a subset of a contour surface of the oxide layer formed by the via and in electrical contact with the back-end-of-line metal layer;
forming a non-volatile memory device over a subset of the conductive film, the subset of the conductive film serving as an electrode for the non-volatile memory device;
forming a volatile resistive-switching selector device electrically in series with the non-volatile memory device; and
forming a second back-end-of-line metal layer overlying a second electrode of the non-volatile memory device and overlying the volatile resistive-switching selector device, wherein the back-end-of-line metal layer or the second back-end-of-line metal layer is electrically connected to the control logic device formed within the substrate.

2. The method of claim 1, the via forming a cross-section in the oxide layer having a shape selected from a group consisting of: a circle, an approximation of a circle, an oval, an approximation of an oval, a polygon, and an approximation of a polygon.

3. The method of claim 1, further comprising polishing the conductive film flush with or approximately flush with a top surface of the oxide layer.

4. The method of claim 1, wherein forming the volatile resistive-switching selector device electrically in series with the non-volatile memory device further comprises:
forming a first conductive film operative to provide first conductive material to facilitate formation of a first conductive filament for the volatile resistive-switching selector device in response to a first polarity voltage;
forming a second conductive filament operative to provide second conductive material to facilitate formation of a second conductive filament for the volatile resistive-switching selector device in response to a second polarity voltage; and
forming an electrically resistive film between the first conductive film and the second conductive film, wherein the electrically resistive film is further operative to facilitate formation of the first conductive filament comprising the first conductive material within the electrically resistive film in response to the first polarity voltage and to facilitate formation of the second conductive filament comprising the second conductive material within the electrically resistive film in response to the second polarity voltage.

5. The method of claim 1, wherein forming the volatile resistive-switching selector device further comprising at least one of:
forming the volatile resistive-switching selector device in direct contact with the subset of the conductive film serving as the electrode for the non-volatile memory device;
forming the volatile selector device in direct contact with a second electrode of the non-volatile memory device; or
forming a second metal layer over the substrate of the memory device and wherein forming the volatile selector device in series with the non-volatile memory device comprises forming the volatile selector device on an opposite side of the second metal layer from the non-volatile memory device.

6. A method of fabricating a memory device, comprising:
forming an oxide layer over a substrate of a memory device;
patterning and etching the oxide layer to form a pillar device comprising oxide layer material;
providing a layer of conductive material over a top surface and one or more lateral surfaces of the pillar device exposed by the patterning and etching;
removing the layer of conductive material from the top surface of the pillar device and forming a top surface of the conductive material substantially coplanar to the top surface of the pillar device;
providing a non-volatile switching material over the layer of conductive material and the top surface of the pillar device and in direct or indirect contact with the conductive material;
forming a second conductive material over the switching material; and
forming a volatile selection device in electrical series with the non-volatile memory device wherein the volatile selection device is a bipolar switching device, in which positive voltage exceeding a positive voltage threshold causes the volatile selection device to activate, and negative voltage exceeding a negative voltage threshold causes the volatile selection device to activate.

7. The method of claim 6, further comprising providing for the non-volatile switching material a material selected from a group consisting of: a silicon-containing material, a silicon oxide, a silicon sub-oxide $SiO_x$ where x has a value between 0.1 and 2, a non-stoichiometric oxide, and a metal oxide.

8. The method of claim 6, wherein a combination of the layer of conductive material, the non-volatile switching material and the second conductive material form a non-volatile memory device.

9. The method of claim 2, further comprising:
filling the via with an insulating material that overlies the conductive film;
etching the insulating material and the conductive film substantially flush with a top surface of the oxide layer; and wherein forming the non-volatile memory device further comprises forming a resistive switching layer overlying and in contact with a top surface of the conductive film and the top surface of the oxide layer.

10. The method of claim 9, further comprising forming the top surface of the conductive film to have a discontinuous surface area, resulting in multiple electrically isolated contact points between the top surfaces of the conductive film and the resistive switching layer overlying the top surface of the conductive film.

11. The method of claim 4, further comprising forming the volatile selector device comprising a volatile switching layer configured to operate as a bipolar switching device, in which a positive activation stimulus activates the volatile selector device and in which a negative activation stimulus activates the volatile selector device.

12. The method of claim 11, further comprising forming the volatile selector device comprising a first selection electrode adjacent to a first surface of the volatile switching layer and a second selection electrode adjacent to a second surface of the volatile switching layer.

13. The method of claim 1, further comprising at least one of:
   forming the volatile resistive-switching selector device between the non-volatile memory device and the back-end-of-line metal layers; or
   forming the volatile resistive-switching selector device between the non-volatile memory device and the second back-end-of-line metal layer.

14. The method of claim 1, further comprising forming the volatile resistive-switching selector device between an electrically conductive layer of the memory device and the first back-end-of-line metal layer, wherein a voltage applied across the electrically conductive layer and the second back-end-of-line metal layer is operative upon the series combination of the non-volatile memory device and the volatile selector device.

15. The method of claim 1, further comprising forming the volatile resistive-switching selector device between an electrically conductive layer of the memory device and the second back-end-of-line metal layer, wherein a voltage applied across the electrically conductive layer and the first back-end-of-line metal layer is operative upon the series combination of the non-volatile memory device and the volatile selector device.

16. A method of fabricating a memory device, comprising:
   providing a substrate comprising a control logic device formed within the substrate;
   forming a back-end-of-line metal layer overlying the substrate and the control logic of the memory device;
   forming an insulator layer over the back-end-of-line metal layer;
   forming a via within the insulator layer;
   providing a layer of conductive material over a surface of the insulator layer exposed by the via;
   forming a second insulator layer over the layer of conductive material and the via within the insulator layer;
   removing the second insulator layer and the layer of conductive material from the top surface of the insulator layer and forming a top surface of the conductive material substantially coplanar to the top surface of the insulator layer and a top surface of the second insulator layer;
   providing a non-volatile switching material over the layer of conductive material and the top surface of the second insulator layer and in electrical contact with the conductive material;
   forming a second conductive material over the switching material;
   forming a volatile resistive-switching selector device in electrical series with the conductive material, the non-volatile switching material and the second conductive material; and
   forming a second back-end-of-line metal layer overlying the second conductive material, wherein the back-end-of-line metal layer or the second back-end-of-line metal layer is electronically connected to the control logic device formed within the substrate.

17. The method of claim 16, further comprising forming the volatile resistive-switching selector device between the second back-end-of-line metal layer and a third back-end-of-line metal layer of the memory device.

18. The method of claim 16, wherein the volatile resistive-switching selection device is a bipolar switching device, in which a positive voltage causes the volatile resistive-switching selection device to activate, and a negative voltage causes the volatile resistive-switching selection device to activate.

19. The method of claim 18, wherein the volatile resistive-switching selection device deactivates in response to the positive voltage dropping below a positive, non-zero threshold voltage and deactivates in response to the negative voltage dropping below a negative, non-zero threshold voltage.

20. The method of claim 16, wherein forming the volatile resistive-switching selector device further comprises:
   forming a first conductive film operative to provide first conductive material to facilitate formation of a first conductive filament for the volatile resistive-switching selector device in response to a first polarity voltage;
   forming a second conductive filament operative to provide second conductive material to facilitate formation of a second conductive filament for the volatile resistive-switching selector device in response to a second polarity voltage; and
   forming a switching material film between the first conductive film and the second conductive film, wherein the switching material film is further operative to facilitate formation of the first conductive filament comprising the first conductive material within the switching material film in response to the first polarity voltage and to facilitate formation of the second conductive filament comprising the second conductive material within the switching material film in response to the second polarity voltage.

* * * * *